US012727414B2

(12) United States Patent
Lu et al.

(10) Patent No.: US 12,727,414 B2
(45) Date of Patent: Sep. 1, 2026

(54) METHOD FOR PROCESSING A SUBSTRATE

(71) Applicant: Tokyo Electron Limited, Tokyo (JP)

(72) Inventors: Yen-Tien Lu, Albany, NY (US); Eric Chih-Fang Liu, Albany, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 260 days.

(21) Appl. No.: 18/604,228

(22) Filed: Mar. 13, 2024

(65) Prior Publication Data

US 2025/0293037 A1 Sep. 18, 2025

(51) Int. Cl.
*H10P 50/00* (2026.01)
*H10P 76/20* (2026.01)

(52) U.S. Cl.
CPC .......... *H10P 50/695* (2026.01); *H10P 50/692* (2026.01); *H10P 76/2041* (2026.01)

(58) Field of Classification Search
CPC .. H10P 50/695; H10P 50/692; H10P 76/2041; H10P 50/71; H10P 50/73; H10P 76/4085
USPC .................................................. 438/696–714
See application file for complete search history.

(56) References Cited

U.S. PATENT DOCUMENTS

| | | | | |
|---|---|---|---|---|
| 11,205,592 | B2 | 12/2021 | Xie et al. | |
| 2013/0277823 | A1* | 10/2013 | Ogisu | H10P 76/4085 257/734 |
| 2022/0392771 | A1 | 12/2022 | Ko | |
| 2023/0422520 | A1* | 12/2023 | Fan | H10B 80/00 |
| 2024/0032294 | A1* | 1/2024 | Hopkins | H10B 41/10 |
| 2024/0063019 | A1* | 2/2024 | Krawicz | H10P 50/287 |

FOREIGN PATENT DOCUMENTS

TW 1724815 B * 4/2021

OTHER PUBLICATIONS

Penny, C. et al., "Subtractive Ru Interconnect Enabled by Novel Patterning Solution for EUV Double Patterning and TopVia with Embedded Airgap Integration for Post Cu Interconnect Scaling," 2022 IEEE International Electron Devices Meeting (IEDM), Dec. 3-7, 2022, 4 pages.

* cited by examiner

*Primary Examiner* — Duy Vu N Deo
(74) *Attorney, Agent, or Firm* — Slater Matsil, LLP

(57) ABSTRACT

A method for processing a substrate includes forming a first mask over a mask line and forming a patterned mask by patterning a mask layer using the first mask as an etch mask. The first mask extending over sidewalls of the mask line and the mask layer is under the mask line. The method further includes forming a pillar and a line under the pillar from a target layer with an etch process by using the patterned mask layer as another etch mask.

23 Claims, 27 Drawing Sheets

METHOD FOR PROCESSING A SUBSTRATE

TECHNICAL FIELD

The present invention relates generally to semiconductor manufacturing, and, in particular embodiments, to a method for processing a substrate.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

The minimum dimension of features in a patterned layer is shrunk periodically to roughly double the component density at each successive technology node, thereby reducing the cost per function. Innovations in patterning, such as immersion deep ultraviolet (i-DUV) lithography, multi patterning, and 13.5 nm wavelength extreme ultraviolet (EUV) optical systems have brought some critical dimensions down to near ten nanometers. This squeezes the margin for pattern misalignment (e.g., Total Edge Placement Error) and leads to, for example, stricter overlay requirements in multi patterning for advanced technology nodes (7 nm and below). As such, innovative process flows are useful for reducing pattern or feature misalignment.

SUMMARY

In accordance with an embodiment, a method for processing a substrate includes: forming a first mask over a mask line, the first mask extending over sidewalls of the mask line; forming a patterned mask by patterning a mask layer using the first mask as an etch mask, the mask layer being under the mask line; and forming a pillar and a line under the pillar from a target layer with an etch process by using the patterned mask layer as another etch mask.

In accordance with another embodiment, a method for processing a substrate includes: forming a tone inversion mask between portions of an upper hardmask; forming a pillar mask over a line of the tone inversion mask; removing the upper hardmask, the removal of the upper hardmask exposing portions of a lower hardmask layer; transferring a pattern of the pillar mask and the tone inversion mask to the lower hardmask layer; and etching a conductive layer under the patterned lower hardmask layer by using the patterned lower hardmask layer as an etching mask, the etching forming a line and a pillar over the line.

In accordance with yet another embodiment, a method for processing a substrate includes: forming a pillar mask over a mask line, the mask line being over a hardmask layer, the hardmask layer covering a conductive layer; forming a patterned hardmask by transferring a pattern of the pillar mask and the mask line to the hardmask layer; removing a portion of the mask line, a remaining portion of the mask line being covered by the pillar mask; removing the pillar mask; etching the conductive layer using the remaining portion of the mask line and the patterned hardmask as a first etch mask; removing a portion of the patterned hardmask, a remaining portion of the patterned hardmask being covered by the remaining portion of the mask line; and forming a conductive pillar over a conductive line by further etching the conductive layer using the remaining portion of the patterned hardmask as a second etch mask, the conductive pillar being under the second etch mask.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
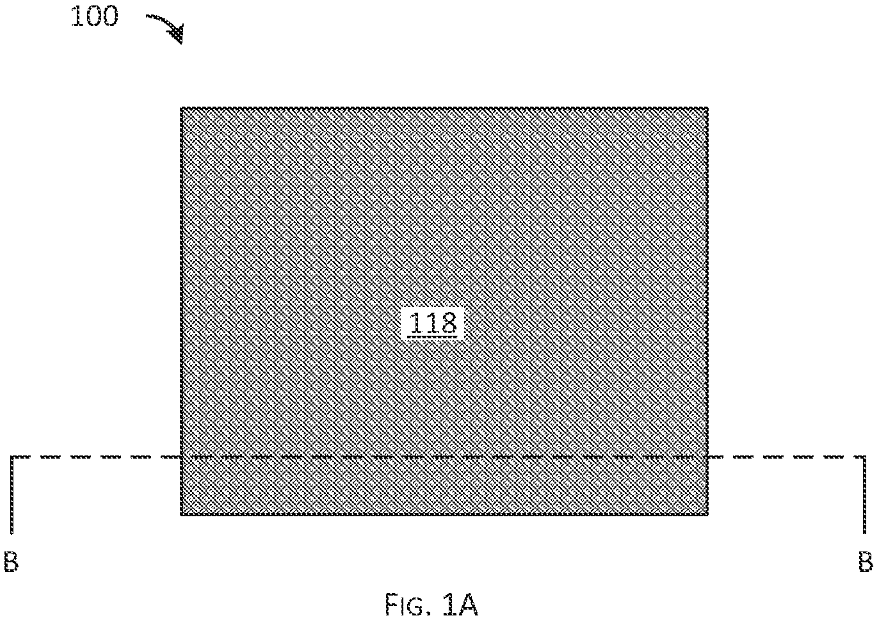
FIG. 1A illustrates a plan view of a semiconductor structure at an intermediate stage of fabrication, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

This application relates to methods for processing a substrate, including subtractive methods of metal interconnect formation. Available existing technology and disclosed intellectual property may not provide sufficient solutions for subtractive etch integration. In order to form interconnect structures by subtractive patterning or etching of metal layers, it is desirable to reverse tone of the interconnect pattern from a design for a process flow in which metal lines and vias are formed with an additive process (e.g., a damascene process flow). For example, a process flow may enable subtractive metal formation of an interconnect metal grid design with tight pitches between metal lines of the grid. A subtractive etch may use tone inversion with self-aligned double patterning processes such as self-aligned blocks (SAB) or self-aligned litho-etch-litho-etch (SALELE). By using two hard mask layers and a tone inversion coat, the tone of a pattern formed in the top hard mask is reversed in the bottom hard mask, allowing for a subtractive etch of an underlying target error. Decoupling the patterning formation and tone inversion steps may reduce integration complexity, including reducing the number of colors needed for etching selectivity. For example, instead of having etch selectivity between three different materials in various layers, etch selectivity between two different materials in various layers may be used.

According to one or more embodiments of the present disclosure, conductive vias (also referred to as conductive pillars) may be formed over conductive lines by improving integration process flows for forming interconnect layers. Conductive pillars and underlying conductive lines may be formed from a single deposition of a conductive layer rather than from separately deposited respective conductive layers for conductive lines and overlying conductive vias. This may be advantageous for simplifying process flows for forming interconnect layers for advanced nodes, such as interconnect layers formed with subtractive etches. The conductive pillars are formed on conductive lines with a self-aligned process during a subtractive etch. As such, creating holes in a dielectric material and filling the holes with conductive material may be avoided. Patterning steps between etches for forming the pillars and lines can likewise be avoided as the pillars and lines may be formed with a subtractive etch process without an intermediate mask layer patterning step.

The present disclosure includes a process flow with a mandrel cut performed after a mandrel formation. A spacer layer formed over the cut mandrels may merge to form blocks with seams covering the cut mandrels. Bottom spacers are formed using non-mandrel blocks formed over the spacer layer prior to a spacer etch. Hard mask layers may include stop layers in order to stop, for example, chemical mechanical polish (CMP) processes.

Embodiments of the disclosure are described in the context of the accompanying drawings. Embodiments of a process flow for patterning a target layer over a substrate will be described using FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, and 25B. Embodiments of methods for processing substrates will be described using FIGS. 26, 27, and 28.

Figure 1B:
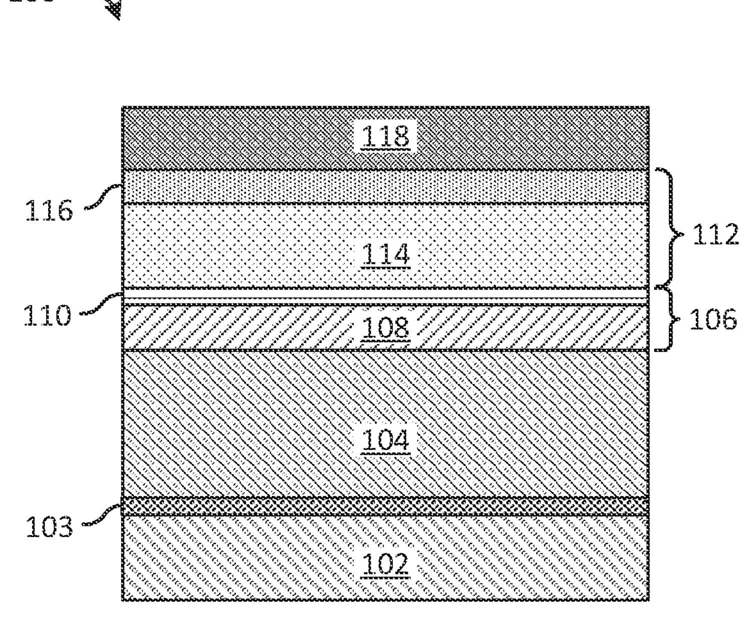
FIG. 1B illustrates a cross-sectional view of a semiconductor structure at an intermediate stage of fabrication, in accordance with some embodiments.

FIGS. 1A and 1B illustrate a plan view and a cross-sectional view of a semiconductor structure 100, in accordance with some embodiments. FIG. 1B is illustrated in a cross-sectional view along line B-B in FIG. 1A. The semiconductor structure 100 comprises a substrate 102, a target layer 104 over the substrate 102, a first hardmask layer 106 over the target layer 104, a second hardmask layer 112 over the first hardmask layer 106, and a mandrel layer 118 over the second hardmask layer 112.

In some embodiments, the substrate 102 is a silicon wafer, or a silicon-on-insulator (SOI) wafer. In certain embodiments, the substrate 102 comprises a silicon germanium wafer, silicon carbide wafer, gallium arsenide wafer, gallium nitride wafer and other compound semiconductors. In other embodiments, the substrate 102 comprises heterogeneous layers such as silicon germanium on silicon, gallium nitride on silicon, silicon carbon on silicon, as well layers of silicon on a silicon or SOI substrate. In various embodiments, the substrate 102 is patterned or embedded in other components of the semiconductor device. In various embodiments, the substrate 102 may be a part of a semiconductor device, and may have undergone a number of steps of processing following, for example, a conventional process. The substrate 102 accordingly may comprise layers of semiconductors useful in various microelectronics. For example, the semiconductor structure 100 may comprise a substrate 102 in which various device regions are formed.

In various embodiments, an upper layer of the substrate 102 comprises a dielectric material such as silicon oxide (SiO), silicon dioxide ($SiO_2$), or a combination thereof, or a silicon-based dielectric material with a low dielectric constant (i.e., low-k value) (e.g., organosilicate glass (SiCOH), dense SiCOH, porous SiCOH, and other porous dielectric materials), the like, or a combination thereof. In some embodiments, a top layer of the substrate 102 is an etch stop layer (not separately illustrated) used to stop a subsequent etching process through the target layer 104. In various embodiments, the etch stop layer comprises a nitride such as silicon nitride (SiN) or the like. The substrate 102 may further comprise one or more interconnect layers of an interconnect structure, over which another interconnect layer will be formed using the process flow illustrated by FIGS. 1A-24B.

In some embodiments, a barrier layer 103 (also referred to as a liner layer) is formed over the substrate 102. The barrier layer 103 comprises a conductive material such as titanium nitride (TiN), tantalum nitride (TaN), the like, or a combination thereof. The barrier layer 103 may be formed with a suitable method such as ALD, CVD, PVD, or the like.

The target layer 104 is formed over the substrate 102 and the barrier layer 103 (if present). In some embodiments, the target layer 104 comprises a conductive material such as a metal and may be referred to as a conductive layer. In an example, the conductive material is ruthenium (Ru) formed using atomic layer deposition (ALD), chemical vapor deposition (CVD), the like, or a combination thereof. However, any suitable conductive material (e.g., copper (Cu)), tin (Sn), tungsten (W), titanium (Ti), hafnium (Hf), silver (Ag), gold (Au), cobalt (Co), nickel (Ni), molybdenum (Mb), niobium (Nb), tantalum (Ta), rhodium (Rh), iridium (Ir), palladium (Pd), indium (In), zinc (Zn), antimony (Sb), ruthenium (Ru), the like, or a combination thereof) and deposition method (e.g., electroplating, electro-less plating, ALD, CVD, PVD, or the like) may be used. In other embodiments, the target layer 104 comprises a dielectric material such as a silicon-based dielectric material with a low dielectric constant (i.e., low-k value) (e.g., organosilicate glass (SiCOH), dense SiCOH, porous SiCOH, and other porous dielectric materials).

In various embodiments, a cover layer (not illustrated) is formed over the target layer 104 with a spin-on process and comprises spin-on glass (SOG). In other embodiments, the cover layer comprises materials formed using CVD such as silicon oxynitride (SiOxNy), silicon dioxide, silicon nitride, silicon carbide, metal oxide, the like, or a combination thereof. The cover layer may reduce or prevent gouging of the underlying target layer 104 during a subsequent patterning of overlying layers.

The first hardmask layer 106 (also referred to as a lower hardmask layer) is formed over the target layer 104. In some embodiments, the first hardmask layer 106 comprises a first mask layer 108 and a first stop layer 110 over the first mask layer 108. The first stop layer 110 is used to stop a removal process (e.g., a chemical mechanical polish (CMP), etch back, or the like) of an overlying layer. In various embodiments, the first mask layer 108 comprises titanium nitride, titanium, titanium oxide, tantalum, other tungsten based compounds, ruthenium based compounds, aluminum based compounds, amorphous silicon, the like, or a combination thereof, and the first stop layer 110 comprises silicon nitride, silicon carbide, silicon oxynitride, silicon oxycarbide, silicon carbonitride, silicon oxycarbonitride, tungsten carbide, the like, or a combination thereof. The first hardmask layer 106 may be formed with a spin-on process, CVD, ALD, the like, or a combination thereof. However, any suitable materials and methods may be used to form the first hardmask layer 106.

The second hardmask layer 112 (also referred to as an upper hardmask layer or a tone inversion layer) is formed over the first hardmask layer 106. The second hardmask layer 112 is used to invert the tone of a patterning process transferring a pattern to the target layer 104. This may provide better control of the pattern transfer between layers, which can reduce edge placement error (EPE), improve line roughness performance, and increase process control of critical dimensions (CDs). In some embodiments, the second hardmask layer 112 comprises a second mask layer 114 over the first mask layer 108 and a second stop layer 116 over the second hardmask layer 112. The second hardmask layer 112 may be formed using similar materials and methods as described above with respect to the first hardmask layer 106, and the details are not repeated herein. However, any suitable materials and methods may be used to form the second hardmask layer 112.

The mandrel layer 118 is formed over the second hardmask layer 112 with a suitable deposition process, such as spin-on, CVD, ALD, the like, or a combination thereof. The mandrel layer 118 will be subsequently patterned to form mandrels 218 (see below, FIGS. 3A-3B) for self-aligned processes such as self-aligned litho-etch-litho-etch (SALELE) or self-aligned block (SAB) processes. In some embodiments, the mandrel layer 118 comprises amorphous silicon, amorphous carbon, metal oxide, metal nitride, metal, or any other type of sacrificial material known within the art. The mandrel layer 118 may also compromise a plasma polymerized organic film, spin on film, or dielectric film.

Figure 2A:
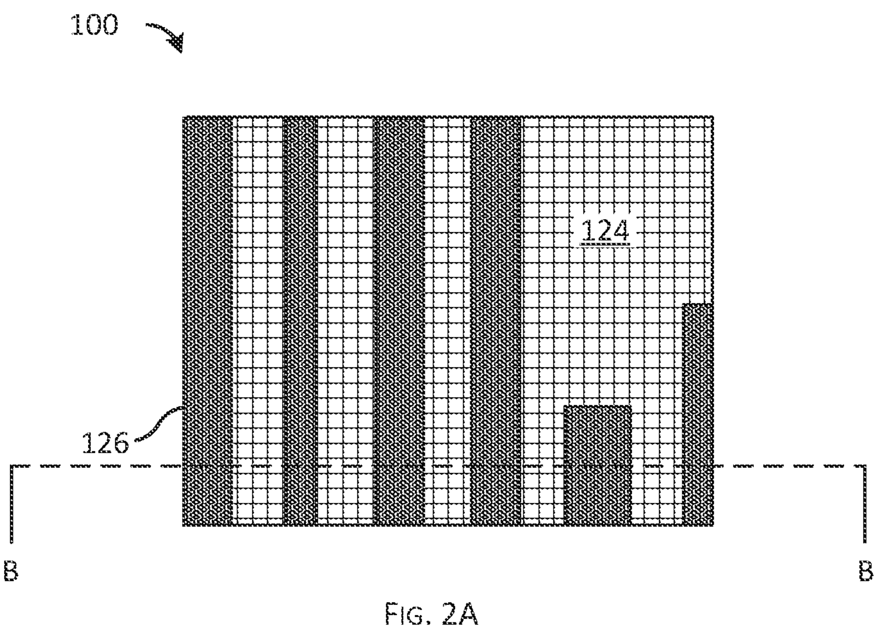
FIG. 2A illustrates a plan view of a semiconductor structure at an intermediate stage of fabrication, in accordance with some embodiments.
Figure 2B:
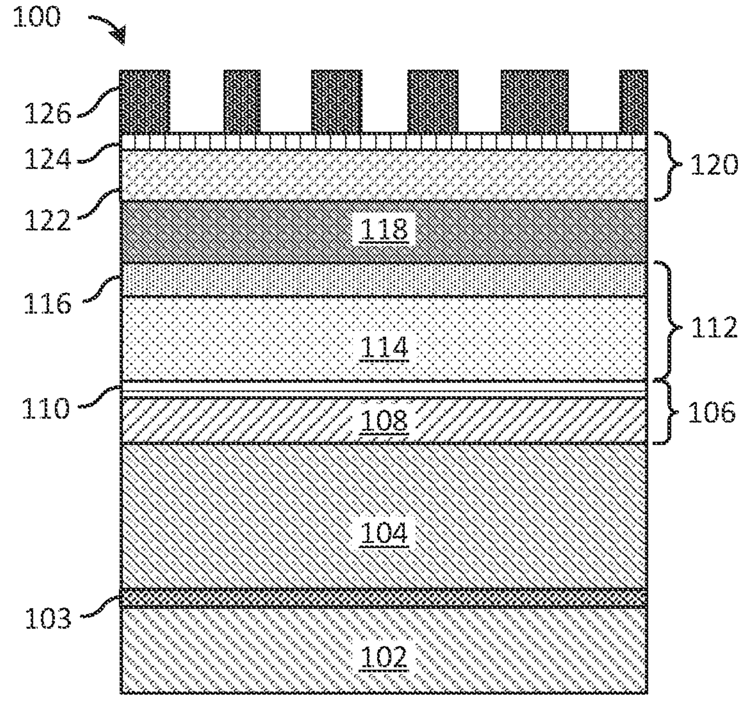
FIG. 2B illustrates a cross-sectional view of a semiconductor structure at an intermediate stage of fabrication, in accordance with some embodiments.

Next, in FIGS. 2A and 2B, a first lithography stack 120 is formed over the mandrel layer 118, in accordance with some embodiments. As illustrated in FIGS. 2A-2B, the first lithography stack 120 comprises a planarizing layer 122 over the mandrel layer 118 and an antireflective coating 124 over the planarizing layer 122. In some embodiments, the planarizing layer 122 comprises spin-on carbon (SOC), an organic planarizing layer (OPL), amorphous carbon, or the like. In some embodiments, the antireflective coating 124 comprises a bottom antireflective coating (BARC) such as a silicon antireflective coating (SiARC), an organic BARC, SiC, spin-on glass (SOG), silicon, silicon oxide, silicon nitride, or the like. However, any suitable materials may be used for the first lithography stack 120, including the planarizing layer 122 and the antireflective coating 124.

A patterned resist 126 is formed over the first lithography stack 120. The patterned resist 126 is used for the subsequent patterning of the mandrel layer 118 (see below, FIGS. 3A-3B). In some embodiments, the patterned resist 126 is a metal oxide resist that is exposed with extreme ultraviolet (EUV) radiation and developed with a wet etch selective to either exposed or unexposed regions of the metal oxide resist. In various embodiments, the patterned resist 126 comprises tin (Sn), antimony (Sb), hafnium (Hf), zirconium (Zr), zinc (Zn), the like, or a combination thereof. In certain embodiments, the patterned resist 126 comprises a metal oxide, a metal alkoxide, or a methacrylate (MAA) of Sn, Sb, Hf, Zr, Zn, or the like. In other embodiments, the patterned resist 126 is a photoresist that does not include metal oxide, e.g., a photopolymeric photoresist. However, any suitable photoresist, exposure method, and development method may be used to form the patterned resist 126.

Figure 3A:
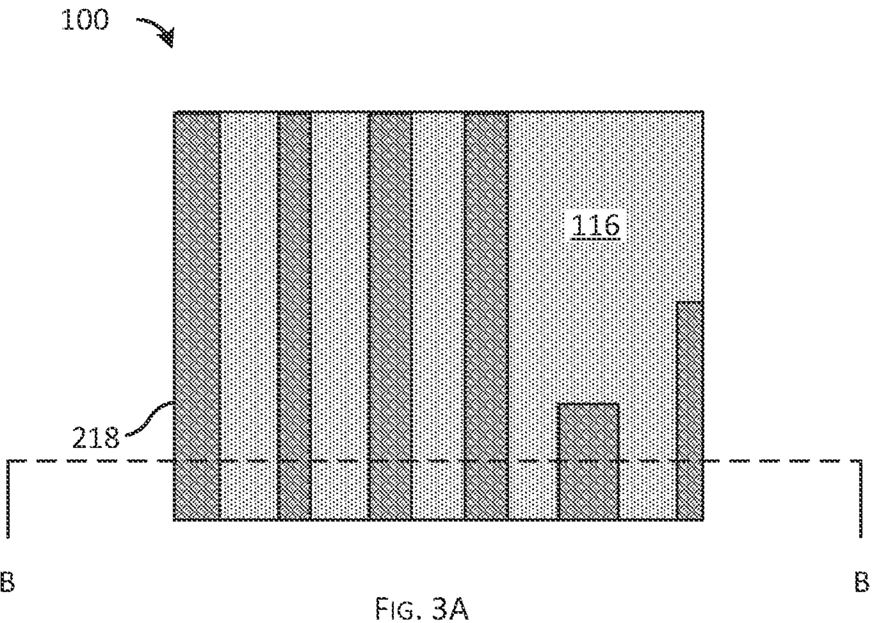
FIG. 3A illustrates a plan view of a semiconductor structure at an intermediate stage of fabrication, in accordance with some embodiments.
Figure 3B:
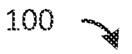
FIG. 3B illustrates a cross-sectional view of a semiconductor structure at an intermediate stage of fabrication, in accordance with some embodiments.
Figure 3B:
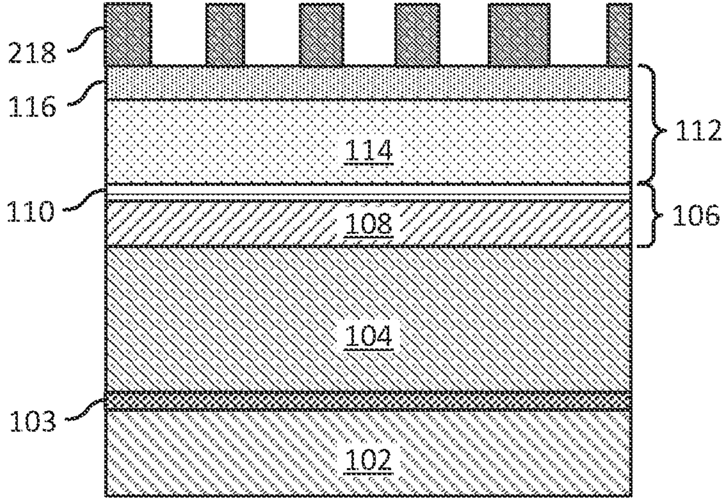

In FIGS. 3A and 3B, the mandrel layer 118 (see above, FIGS. 2A-2B) is patterned to form mandrels 218, in accordance with some embodiments. Although six mandrels 218 are illustrated in FIG. 3A-3B with four full-length mandrels crossing the top view of FIG. 3A and two shortened mandrels on a right side of the four full-length mandrels, any suitable number of mandrels 218 with any suitable lengths and arrangements may be formed. For example, additional mandrels (not illustrated) with any suitable lengths may be present on the right and left sides of FIG. 3A. In some embodiments, the mandrels 218 are formed with a multi-step etching process. For example, the patterned resist 126 may be used as an etch mask to pattern a portion of the first lithography stack 120 with a suitable wet or dry etching process (e.g., an RIE process or the like using anisotropic plasma etching). The patterned portion of the first lithography stack 120 is then used as an etch mask to etch the remaining portion of the first lithography stack 120. Next, the remaining portion of the first lithography stack 120 is used as an etch mask to form the mandrels 218. After patterning the mandrels 218, any remaining portions of the first lithography stack 120 and the patterned resist 126 are removed with a suitable process, such as a CMP, an etch back, or the like.

Figure 4A:
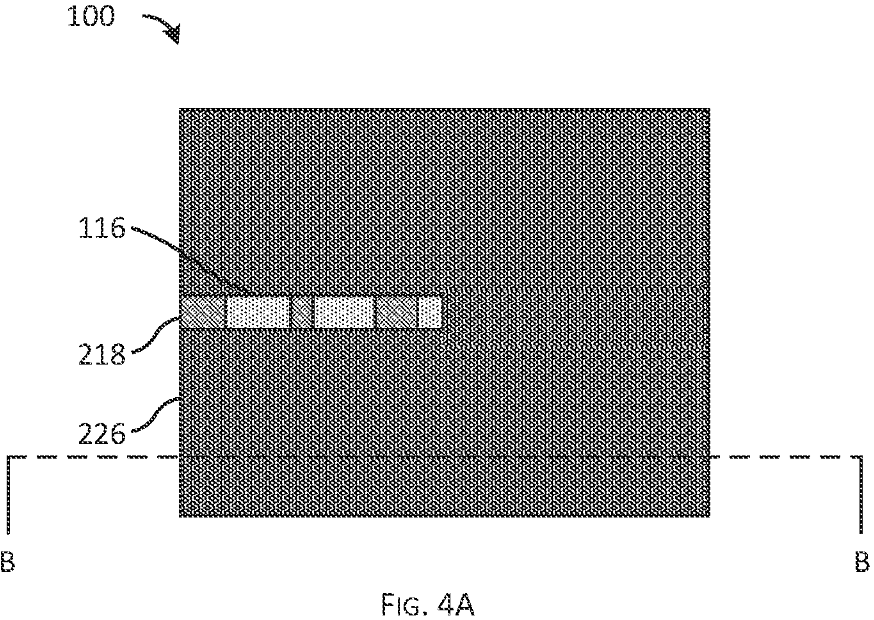
FIG. 4A illustrates a plan view of a semiconductor structure at an intermediate stage of fabrication, in accordance with some embodiments.
Figure 4B:
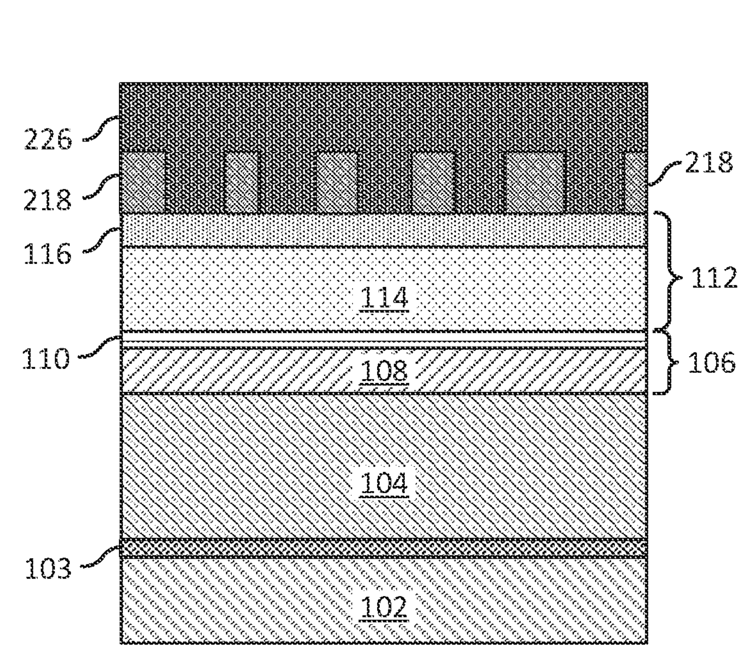
FIG. 4B illustrates a cross-sectional view of a semiconductor structure at an intermediate stage of fabrication, in accordance with some embodiments.

Next, in FIGS. 4A and 4B, a patterned resist 226 is formed over the mandrels 218 and exposed portions of the second hardmask layer 112, in accordance with some embodiments. The patterned resist 226 comprises one or more trenches or holes that expose portions of the mandrels 218 that will be subsequently cut with a mandrel cut process (see below, FIGS. 5A-5B). As illustrated by FIGS. 4A-4B, the patterned resist 226 exposes a rectangular region (also referred to as a trench) across three mandrels 218. However, the patterned resist 226 may expose any suitable numbers and portions of the mandrels 218 in order to form any desired cuts through the mandrels 218.

The patterned resist 226 may be formed using similar methods and materials as the patterned resist 126 as described above with respect to FIGS. 2A-2B, and the details are not repeated herein. In some embodiments, additional layers of a lithography stack may be formed over the mandrels 218 and exposed portions of the second hardmask layer 112 prior to forming the patterned resist 226. However, any suitable methods and materials may be used to form the patterned resist 226.

Figure 5A:
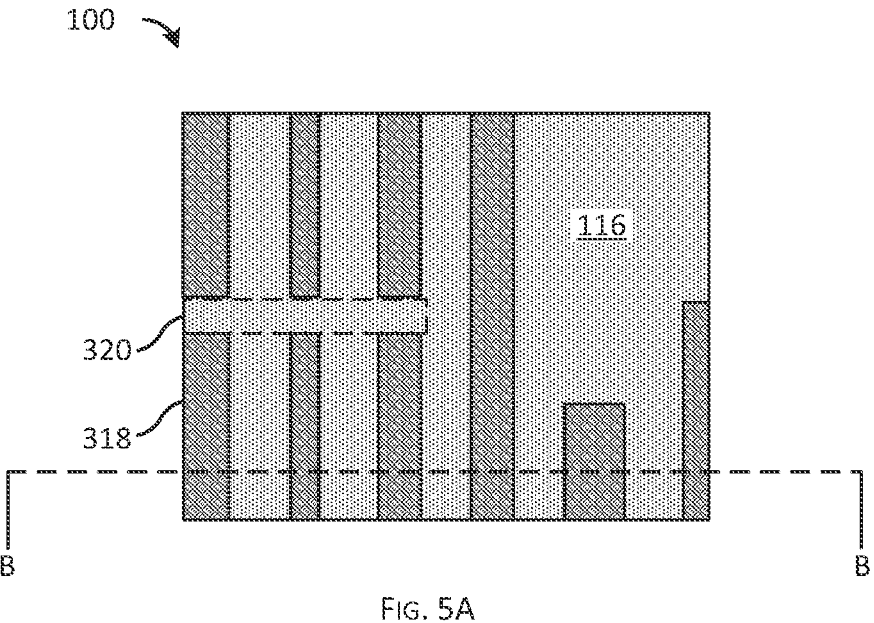
FIG. 5A illustrates a plan view of a semiconductor structure at an intermediate stage of fabrication, in accordance with some embodiments.
Figure 5B:
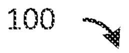
FIG. 5B illustrates a cross-sectional view of a semiconductor structure at an intermediate stage of fabrication, in accordance with some embodiments.
Figure 5B:
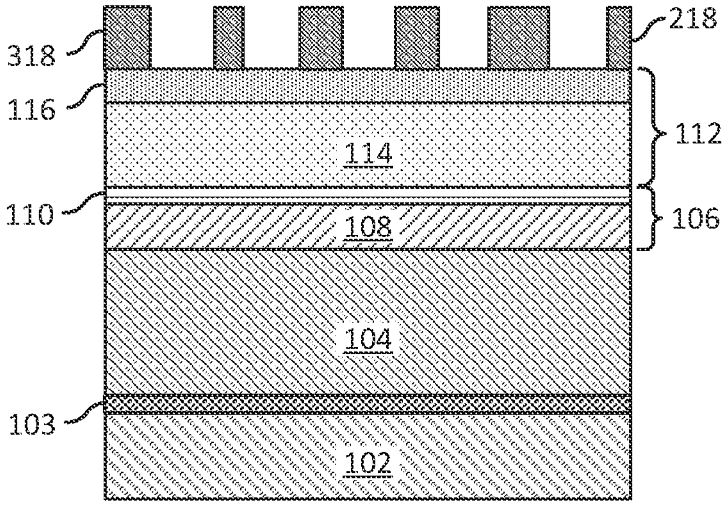

Subsequently, in FIGS. 5A and 5B, a mandrel cut process is performed to form a cut 320 through one or more of the mandrels 218 to form cut mandrels 318, in accordance with some embodiments. In some embodiments, the patterned resist 226 (and any underlying layers of a lithography stack, if present) is used as an etch mask to form the cut 320 with a suitable wet or dry etching process (e.g., an RIE process or the like using anisotropic plasma etching). After forming the cut 320 through the cut mandrels 318, any remaining portions of the patterned resist 226 (and any underlying layers of a lithography stack, if present) are removed with a suitable process, such as a CMP, an etch back, an ashing, or the like. As illustrated by FIG. 5A, the cut 320 bisects three cut mandrels 318. However, any suitable numbers of cuts 320 may be formed in any suitable positions in order to form any desired cuts through the cut mandrels 318.

Figure 6A:
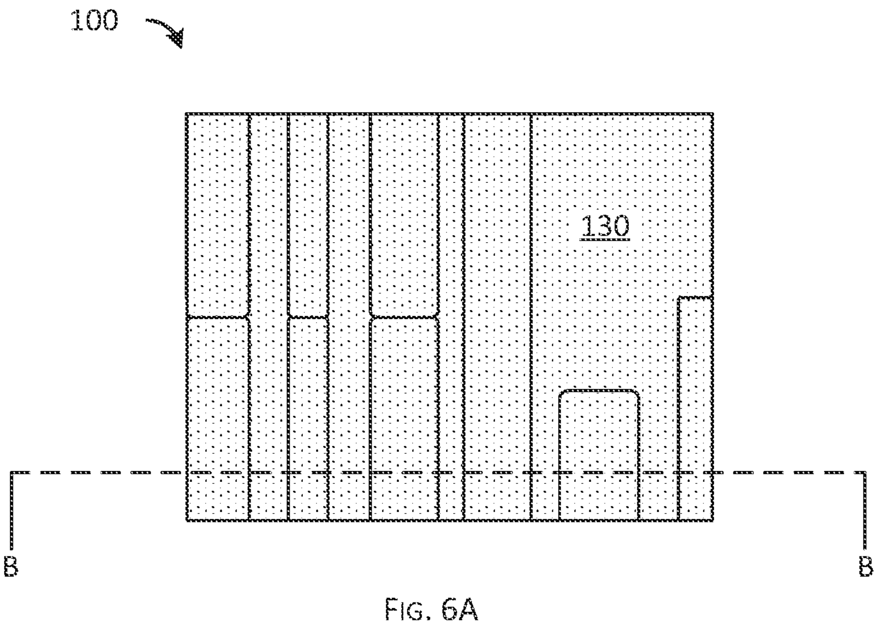
FIG. 6A illustrates a plan view of a semiconductor structure at an intermediate stage of fabrication, in accordance with some embodiments.
Figure 6A:
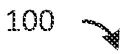
Figure 6B:
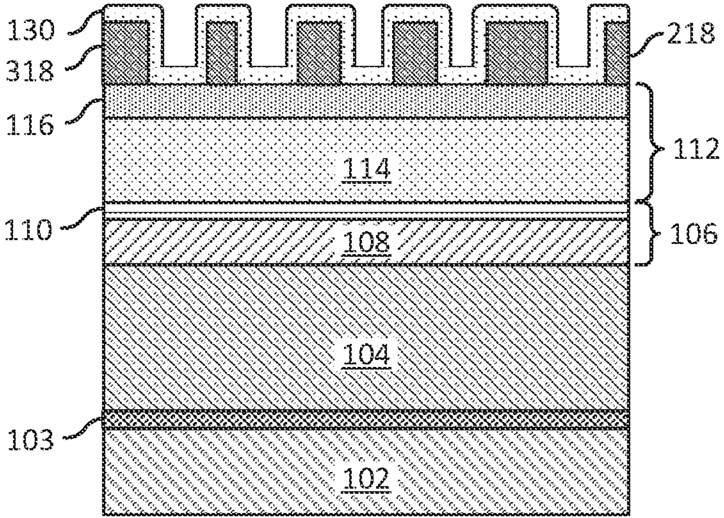
FIG. 6B illustrates a cross-sectional view of a semiconductor structure at an intermediate stage of fabrication, in accordance with some embodiments.

In FIGS. 6A and 6B, a spacer layer 130 is formed over the mandrels 218, cut mandrels 318, and exposed portions of the second hardmask layer 112, in accordance with some embodiments. The spacer layer 130 may be formed by depositing spacer material roughly conformally over the over the mandrels 218, cut mandrels 318, and exposed portions of the second hardmask layer 112 with a suitable process such as ALD or the like. In some embodiments, the spacer material is an oxide or nitride such as titanium oxide, titanium nitride, silicon oxide, silicon nitride, zirconium oxide, the like, or a combination thereof. The spacer material is different from the material of the mandrels 218 and cut mandrels 318 so that subsequent etches may be selective to the mandrels 218 and cut mandrels 318 over spacers subsequently formed from the spacer layer 130 (see below, FIGS. 11A-11B). In some embodiments, the spacer layer 130 fills the cut 320 between respective portions of cut mandrels 318 so that portions of the spacer layer 130 over the cut mandrels 318 meet and merge at seams between the respective portions of the cut mandrels 318. As such, the spacer layer 130 may form merged blocks that cover cut mandrels 318 across the cuts 320 between the cut mandrels 318.

Figure 7A:
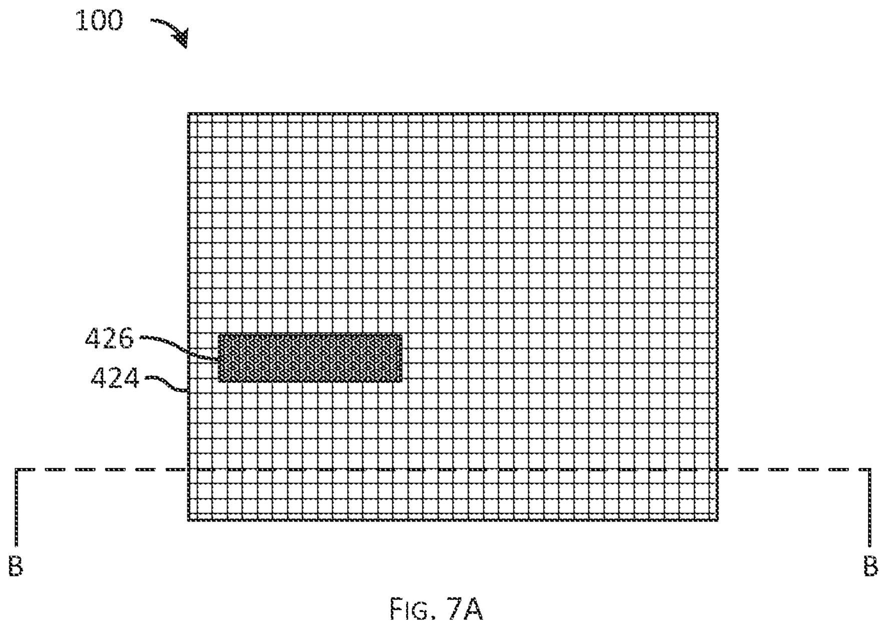
FIG. 7A illustrates a plan view of a semiconductor structure at an intermediate stage of fabrication, in accordance with some embodiments.
Figure 7B:
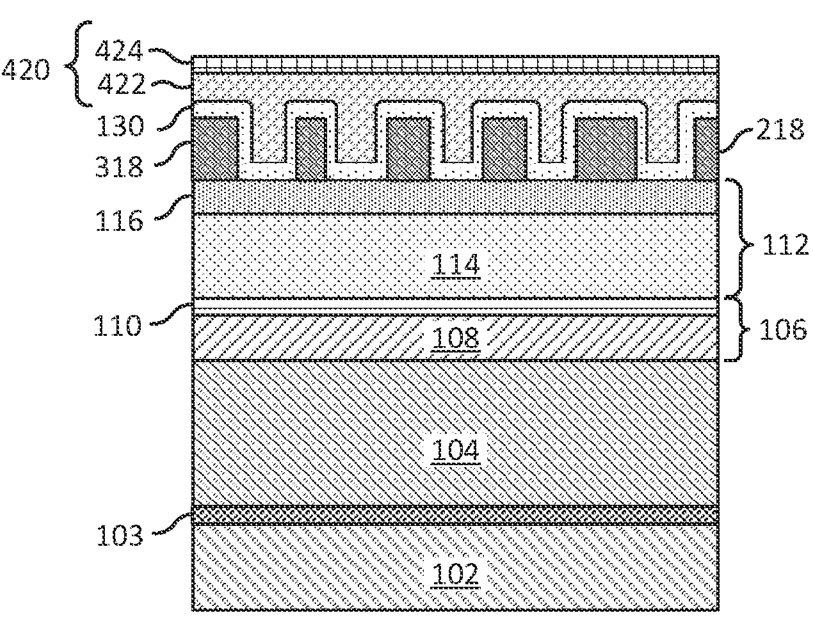
FIG. 7B illustrates a cross-sectional view of a semiconductor structure at an intermediate stage of fabrication, in accordance with some embodiments.

Next, in FIGS. 7A and 7B, a second lithography stack 420 is formed over the spacer layer 130 and a patterned resist 426 is formed over the second lithography stack 420, in accordance with some embodiments. As illustrated in FIGS. 7A-7B, the second lithography stack 420 comprises a planarizing layer 422 over the spacer layer 130 and an antireflective coating 424 over the planarizing layer 422. The second lithography stack 420 and the patterned resist 426 may be formed with similar methods and materials as the first lithography stack 120 and the patterned resist 126 as described above with respect to FIGS. 2A-2B, and the details are not repeated herein.

In some embodiments, the patterned resist 426 is formed as one or more horizontal bars in a plan view with longitudinal directions being perpendicular to longitudinal directions of the cut mandrels 318 and mandrels 218. The patterned resist 426 may be used to protect portions of the planarizing layer 422 in order to form blocks (see below, FIGS. 8A-8B) between cut mandrels 318. Although the patterned resist 426 is illustrated as extending over three cut mandrels 318, the patterned resist 426 may be formed in any suitable numbers and positions, and all such configurations are within the scope of the disclosed embodiments.

Figure 8A:
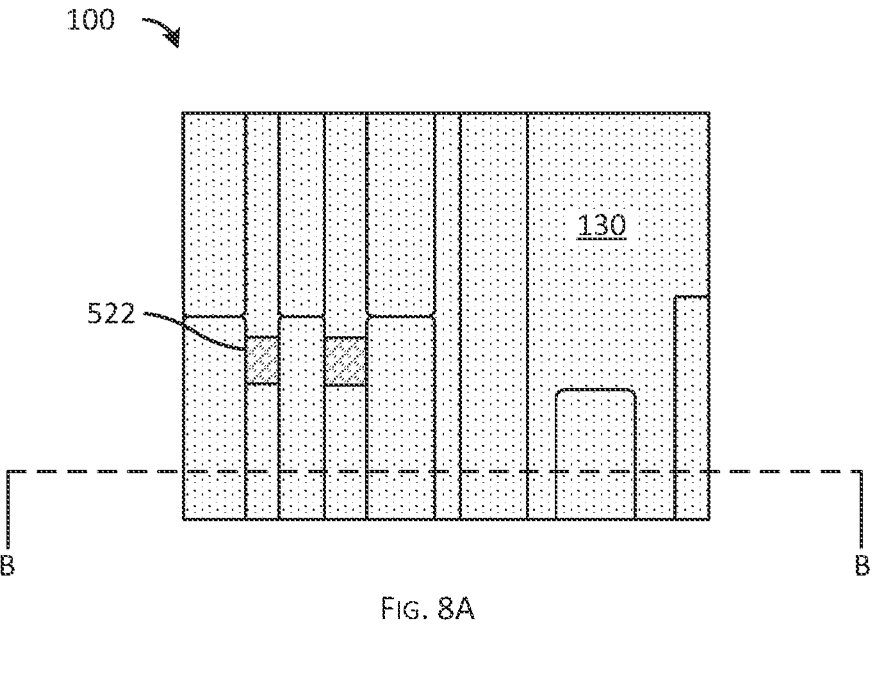
FIG. 8A illustrates a plan view of a semiconductor structure at an intermediate stage of fabrication, in accordance with some embodiments.
Figure 8B:
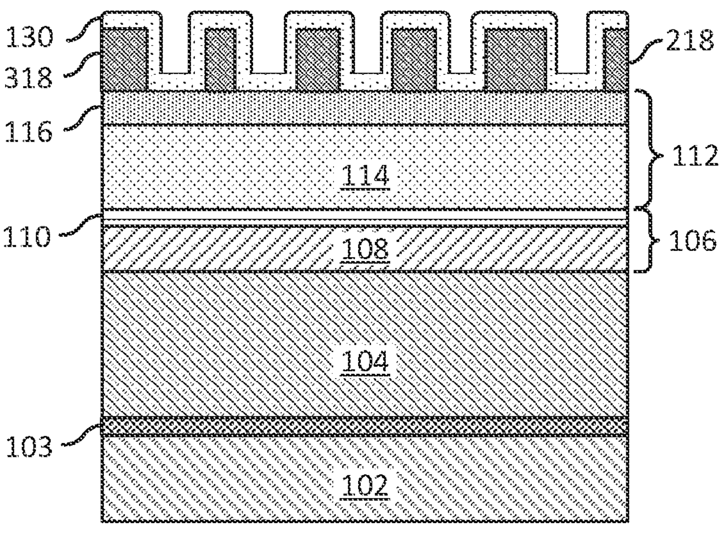
FIG. 8B illustrates a cross-sectional view of a semiconductor structure at an intermediate stage of fabrication, in accordance with some embodiments.

Subsequently, in FIGS. 8A and 8B, the patterned resist 426, the antireflective coating 424, and portions of the planarizing layer 422 are removed with a suitable process, such as a wet or dry etching process (e.g., an RIE process or the like using anisotropic plasma etching), in accordance with some embodiments. Remaining portions of the planarizing layer 422 under the patterned resist 426 are protected by the patterned resist 426 and form blocks 522 (also referred to as non-mandrel blocks). The blocks 522 are between sidewalls of the spacer layer 130 and over cut mandrels 318 or mandrels 218. The blocks 522 may be used to form bottom spacers used in subsequent patterning processes.

In other embodiments, the blocks 522 are formed by forming a mask (e.g., a patterned photoresist) over the semiconductor structure 100 as illustrated above in FIGS. 6A-6B with trenches that expose one or more regions of the spacer layer 130 over cut mandrels 318. The trenches are subsequently filled with a material (e.g., spin-on carbon). The mask and a top portion of the material over top surfaces of the spacer layer 130 are then removed with a suitable process (e.g., an etch back or CMP) to form the blocks 522. However, any suitable process or materials may be used to form the blocks 522.

Figure 9A:
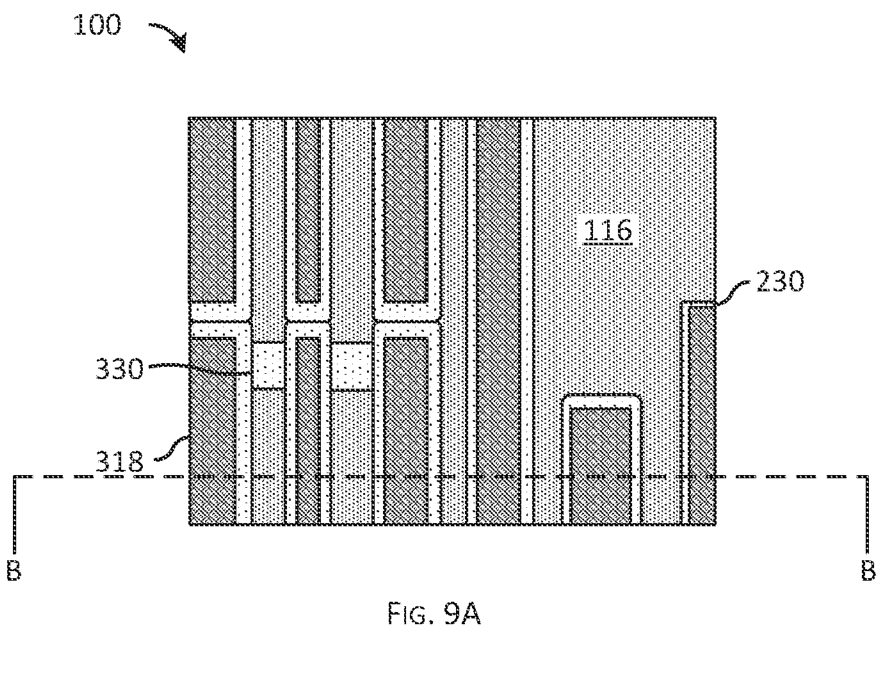
FIG. 9A illustrates a plan view of a semiconductor structure at an intermediate stage of fabrication, in accordance with some embodiments.
Figure 9B:
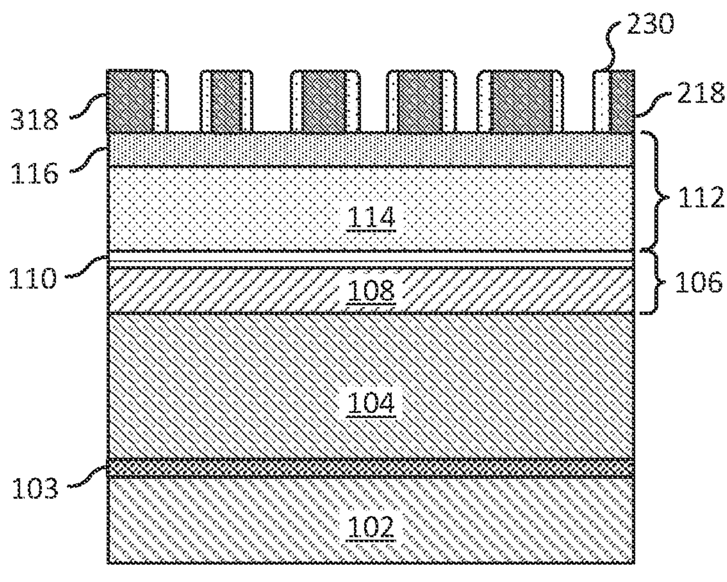
FIG. 9B illustrates a cross-sectional view of a semiconductor structure at an intermediate stage of fabrication, in accordance with some embodiments.

In FIGS. 9A and 9B, the spacer layer 130 is etched to form spacers 230 and bottom spacers 330, in accordance with some embodiments. The material of the spacer layer 130 is selectively etched using an anisotropic etching technique (e.g., a reactive ion etch (RIE)) that clears the tops of the mandrels 218 and cut mandrels 318 and removes spacer material from over the first stop layer 116 between the mandrels 218 and cut mandrels 318 to form the spacers 230 around sidewalls of the mandrels 218 and cut mandrels 318.

Spacer material under the blocks 522 is protected from the anisotropic etching technique by the blocks 522 and forms bottom spacers 330, which extend between adjacent spacers 230 and cover portions of the first stop layer 116. The blocks 522 may be removed by the anisotropic etching technique or by a subsequent suitable removal process such as an ashing. The bottom spacers 330 may have a smaller vertical thickness than the vertical thickness of the spacers 230, so that a top surface of the bottom spacers 300 is below a top surface of the spacers 230.

Figure 10A:
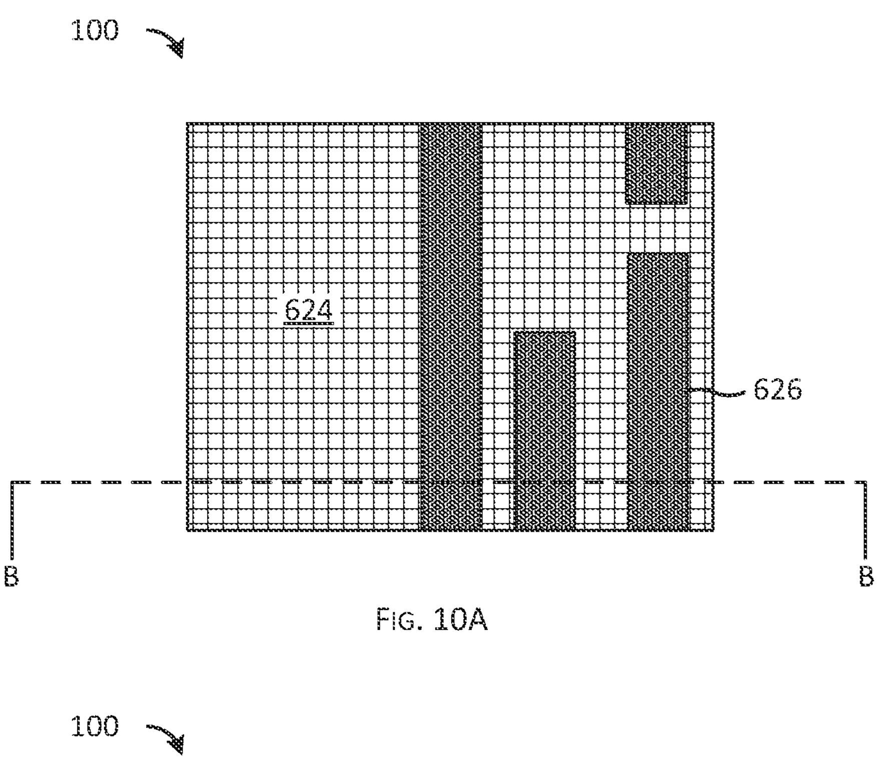
FIG. 10A illustrates a plan view of a semiconductor structure at an intermediate stage of fabrication, in accordance with some embodiments.
Figure 10B:
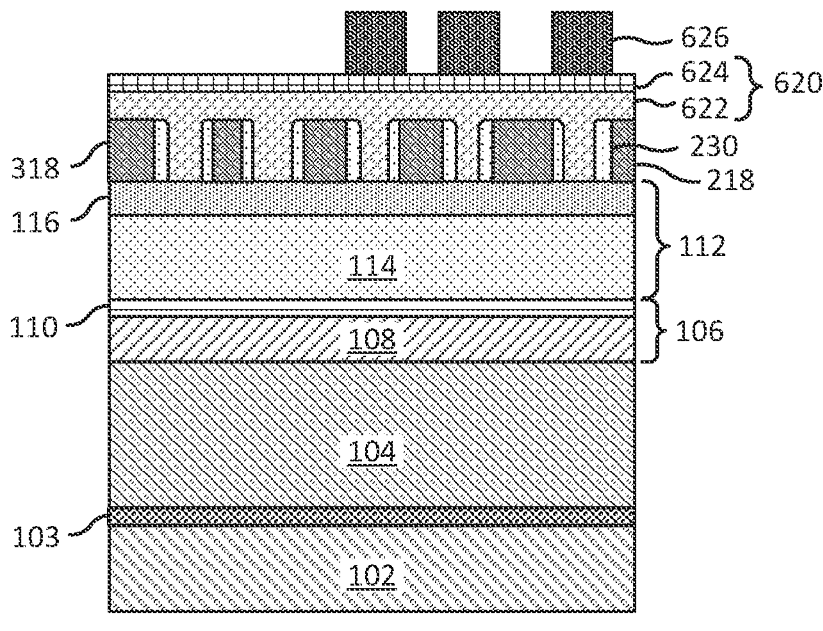
FIG. 10B illustrates a cross-sectional view of a semiconductor structure at an intermediate stage of fabrication, in accordance with some embodiments.

Subsequently, in FIGS. 10A and 10B, a third lithography stack 620 is formed over the spacers 230, bottom spacers 330, mandrels 218, cut mandrels 318, and first stop layer 116, and a patterned resist 626 is formed over the third lithography stack 620, in accordance with some embodiments. As illustrated in FIGS. 10A-10B, the third lithography stack 620 comprises: a planarizing layer 622 over the spacers 230, bottom spacers 330, mandrels 218, cut mandrels 318, and first stop layer 116; and an antireflective coating 624 over the planarizing layer 622. The third lithography stack 620 and the patterned resist 626 may be formed with similar methods and materials as the first lithography stack 120 and the patterned resist 126 as described above with respect to FIGS. 2A-2B, and the details are not repeated herein.

In some embodiments, the patterned resist 626 is formed as one or more bars with longitudinal directions being parallel to longitudinal directions of the cut mandrels 318 and mandrels 218. The bars of the patterned resist 626 may be formed over spacers 230 on sidewalls of adjacent mandrels 218 or cut mandrels 318. The bars of the patterned resist 626 may have staggered lengths or be separated by vertical gaps in a plan view. The patterned resist 426 may be used to protect portions of the third lithography stack 620 in order to form blocks (see below, FIGS. 11A-11B) between cut mandrels 318. Although the patterned resist 426 is illustrated as extending over three cut mandrels 318, the patterned resist 426 may be formed in any suitable numbers and positions, and all such configurations are within the scope of the disclosed embodiments.

Figure 11A:
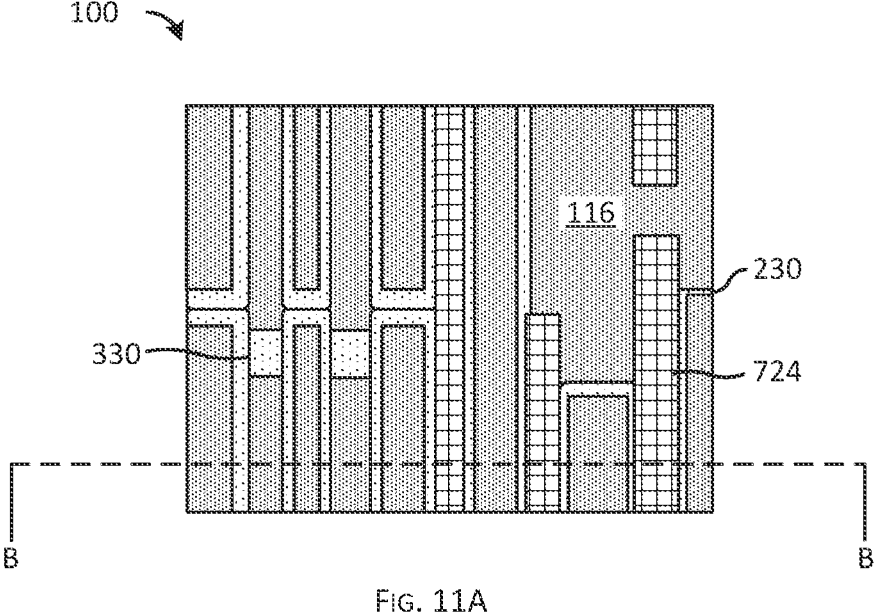
FIG. 11A illustrates a plan view of a semiconductor structure at an intermediate stage of fabrication, in accordance with some embodiments.
Figure 11A:
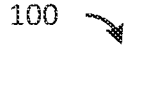
Figure 11B:
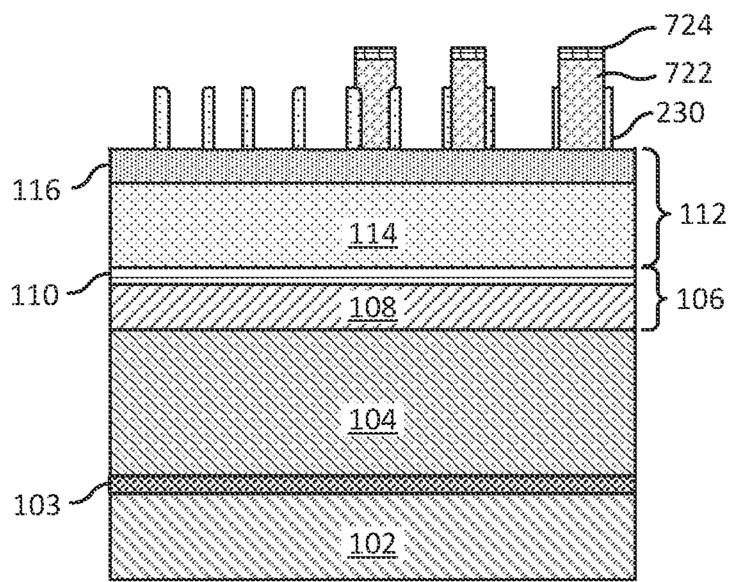
FIG. 11B illustrates a cross-sectional view of a semiconductor structure at an intermediate stage of fabrication, in accordance with some embodiments.

Next, in FIGS. 11A and 11B, an etching process is performed to remove portions of the third lithography stack 620, the mandrels 218, and the cut mandrels 318, in accordance with some embodiments. The patterned resist 626 protects underlying portions of the planarizing layer 622 during the etching process so that the underlying portions form blocks 722. In some embodiments, patterned portions 724 of the antireflective coating 624 remain over the blocks 722 after the etching process. Any remaining portions of the patterned resist 626 are removed with a suitable process, such as a CMP, an etch back, or the like.

The mandrels 218 and the cut mandrels 318 may be removed with a suitable dry or wet etching process (e.g., an RIE or the like using anisotropic plasma etching) that is selective to the material of the mandrels 218 and the cut mandrels 318 over the materials of the spacers 230, the bottom spacers 330, and the first stop layer 116. In some embodiments, the mandrels 218 and cut mandrels 318 are removed with a same etching process as the portions of the third lithography stack 620. In other embodiments, the portions of the third lithography stack 620 are removed with a different etching process than the etching process subsequently used to remove the mandrels 218 and the cut mandrels 318. After removing the mandrels 218 and the cut mandrels 318, the spacers 230, the bottom spacers 330, and the blocks 722 form a pattern that is subsequently transferred to underlying layers (see below, FIGS. 12A-17B).

Figure 12A:
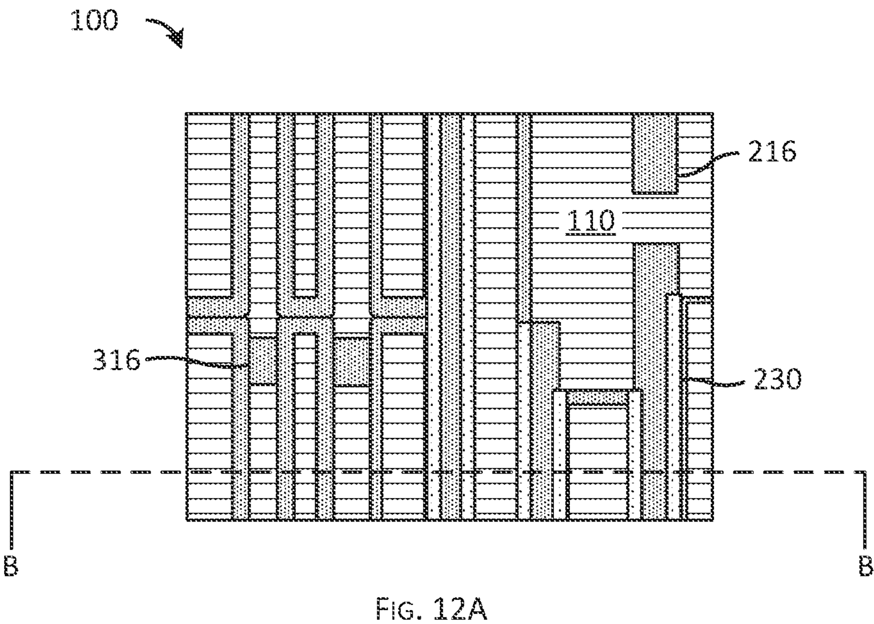
FIG. 12A illustrates a plan view of a semiconductor structure at an intermediate stage of fabrication, in accordance with some embodiments.
Figure 12B:
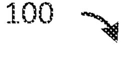
FIG. 12B illustrates a cross-sectional view of a semiconductor structure at an intermediate stage of fabrication, in accordance with some embodiments.
Figure 12B:
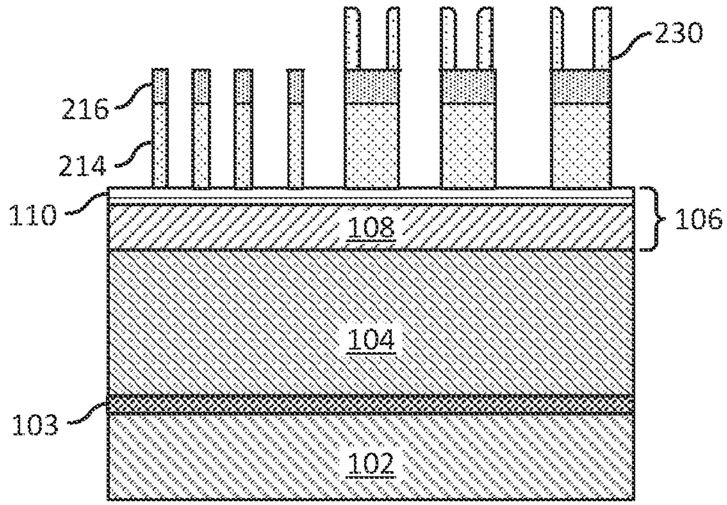

In FIGS. 12A and 12B, the pattern of the spacers 230, the bottom spacers 330, and the blocks 722 is transferred to the second hardmask layer 112, in accordance with some embodiments. The spacers 230, the bottom spacers 330, and the blocks 722 are used as an etching mask in an etching process (e.g., a suitable wet or dry process) to extend the pattern of the spacers 230, the bottom spacers 330, and the blocks 722 through the second hardmask layer 112. This etching process patterns the second stop layer 116 and the second mask layer 114 to form a patterned stop layer 216 over a patterned mask 214. Portions of a top surface of the first hardmask layer 106 may be exposed by the patterned mask 214. The spacers 230, the bottom spacers 330, the patterned portions 724 (if present), and the blocks 722 are removed by the etching process. In some embodiments, portions of the spacers 230 remain over the patterned stop layer 216.

Figure 13A:
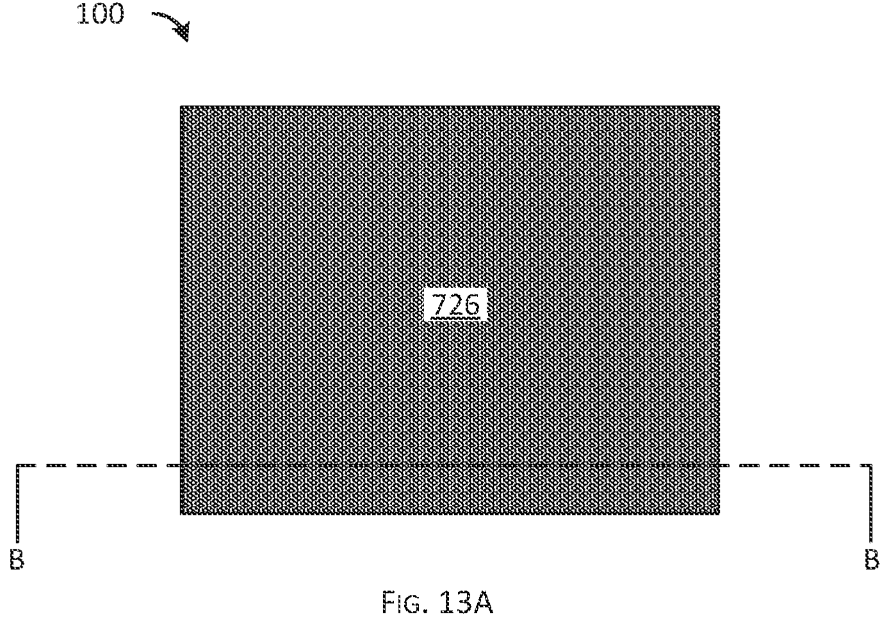
FIG. 13A illustrates a plan view of a semiconductor structure at an intermediate stage of fabrication, in accordance with some embodiments.
Figure 13B:
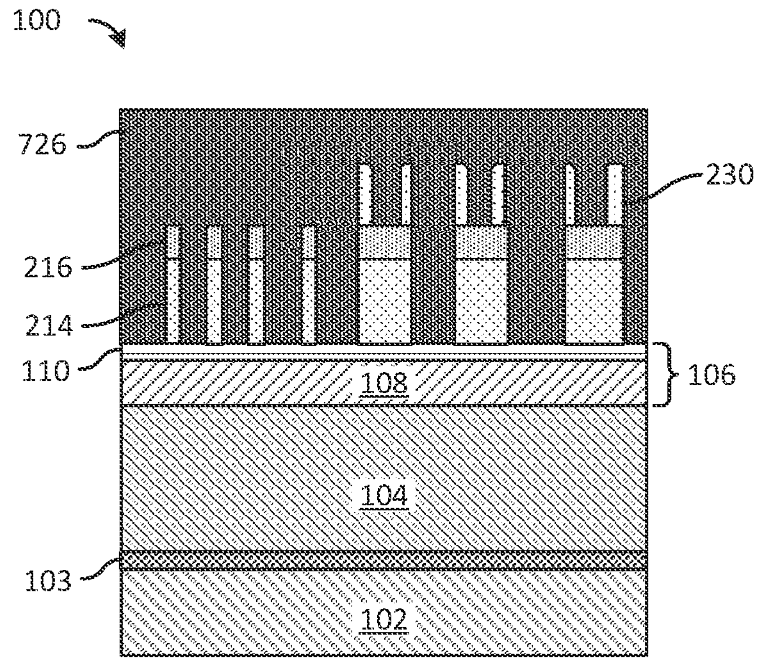
FIG. 13B illustrates a cross-sectional view of a semiconductor structure at an intermediate stage of fabrication, in accordance with some embodiments.

Next, in FIGS. 13A and 13B, a tone inversion coat 726 is formed over remaining portions of the spacers 230 (if present), the patterned stop layer 216, the patterned mask 214, and exposed portions of the top surface of the first hardmask layer 106, in accordance with some embodiments. The tone inversion coat 726 fills spaces (e.g., trenches or holes) between portions of the patterned mask 214 and the patterned stop layer 216. The tone inversion coat 726 is used to invert the tone of the patterning process, so that portions of the target layer 104 under the patterned mask 214 may be etched through in a subsequent subtractive process while remaining portions of the target layer 104 are protected by another patterned mask with an opposite tone from the patterned mask 214 (see below, FIGS. 14A-17B). This may provide better control of the pattern transfer by enabling a subtractive etch of the target layer 104, which can reduce edge placement error (EPE), improve line roughness performance, and increase process control of critical dimensions (CDs).

The tone inversion coat 726 comprises an oxide such as titanium oxide, silicon oxide, aluminum oxide, another material such as amorphous silicon, amorphous carbon, spin-on carbon, the like, or a combination thereof. The tone inversion coat 726 may be formed with a spin-on process, CVD, ALD, the like, or a combination thereof. However, any suitable materials and methods may be used to form the tone inversion coat 726.

Subsequently, in FIGS. 14A and 14B, a top portion of the tone inversion coat 726 is removed to expose a top surface of the patterned mask 214, in accordance with some embodiments. The top portion of the tone inversion coat 726 may be removed with a suitable process such as a planarization (e.g., a CMP), an etch back, the like, or a combination thereof, with the remaining portion of the tone inversion coat 726 forming a tone inversion mask 826. Portions of the tone inversion mask 826 may subsequently be used to transfer a pattern to the target layer 104, such as to form conductive lines. These portions of the tone inversion mask 826 may be referred to as lines or mask lines of the tone inversion mask 826.

In some embodiments where the removal process comprises a CMP, the patterned stop layer 216 is used to stop the removal process at a suitable height. The removal process may remove the remaining portions of the spacers 230 (if present) and the patterned stop layer 216. In some embodiments, portions of the patterned stop layer 216 remain over the patterned mask 214 after the removal process.

FIGS. 15A, 15B, 16A, 16B, 17A, 17B, 18A, 18B, 19A, 19B, 20A, 20B, 21A, 21B, 22A, 22B, 23A, 23B, 24A, 24B, 25A, and 25B illustrate plan and cross-sectional views of intermediate stages in a process for forming conductive pillars and underlying conductive lines from a single conductive layer (e.g., the target layer 104), in accordance with some embodiments. Conductive pillars are formed on conductive lines during a subtractive etch with a self-aligned process. This may be advantageous for simplifying process flows for forming interconnect layers for advanced nodes. This process may allow for avoiding creating holes in a dielectric material and filling the holes with conductive material. Additionally, patterning steps between etches for forming the pillars and lines may be avoided as the pillars and lines may be formed with a subtractive etch process without an intermediate mask layer patterning step.

Figure 15A:
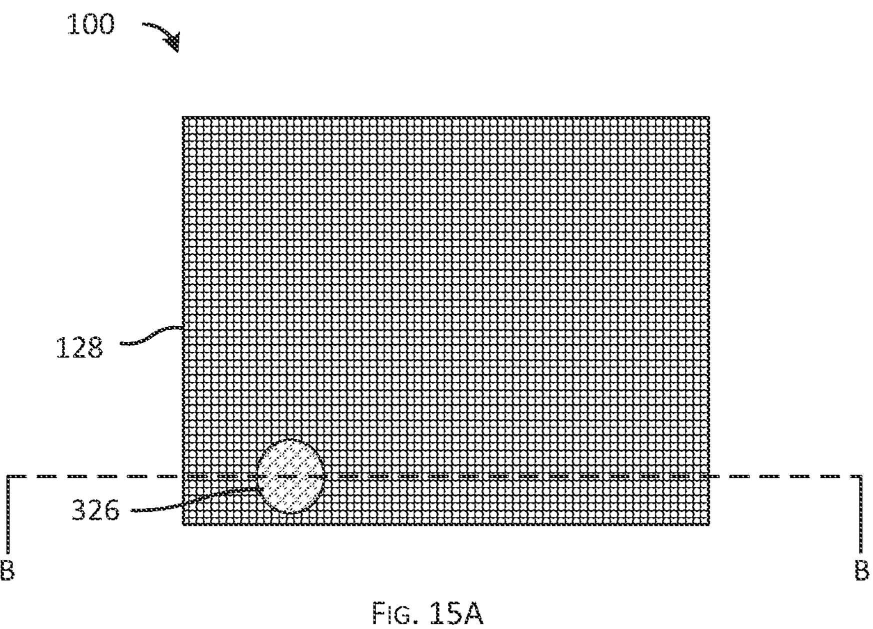
FIG. 15A illustrates a plan view of a semiconductor structure at an intermediate stage of fabrication, in accordance with some embodiments.
Figure 15B:
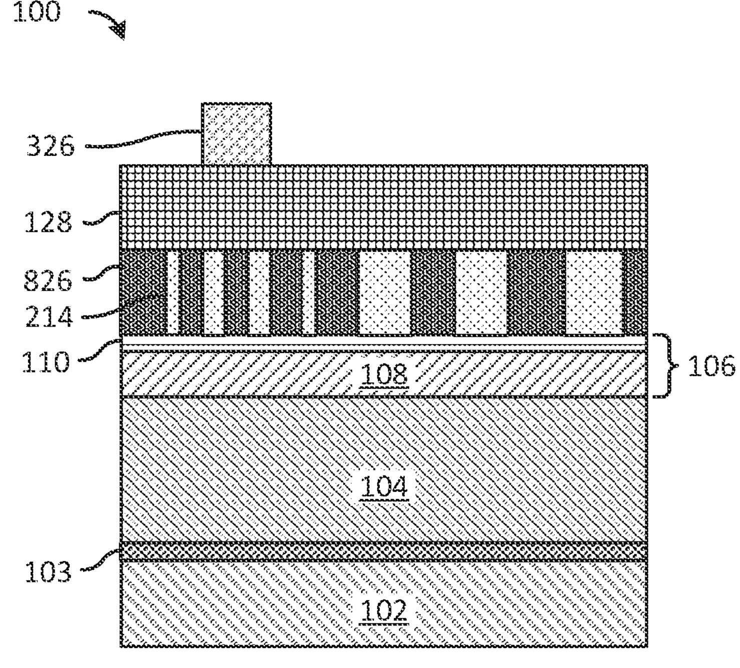
FIG. 15B illustrates a cross-sectional view of a semiconductor structure at an intermediate stage of fabrication, in accordance with some embodiments.

In FIGS. 15A and 15B, a pillar hardmask layer 128 is formed over the patterned mask 214 and the tone inversion mask 826 and a patterned resist 326 is formed over the pillar hardmask layer 128, in accordance with some embodiments. The pillar hardmask layer 128 will subsequently be patterned into a pillar mask (see below, FIGS. 16A-16B) using the patterned resist 326 in order to form a pillar over a line from the target layer 104 in a subsequent subtractive etch process.

The pillar hardmask layer 128 may be formed using similar materials and methods as the first hardmask layer 106 as described above with respect to FIGS. 1A-1B, and the details are not repeated herein. However, any suitable materials and methods may be used to form the pillar hardmask layer 128.

The patterned resist 326 (also referred to as a pillar photoresist mask) is patterned to cover a portion of the pillar hardmask layer 128 that will subsequently be used to form a pillar mask (see below, FIGS. 16A-16B). In some embodiments, the patterned resist 326 comprises a round shape (e.g., a circular or oval shape) in a plan view, as illustrated by FIG. 15A. However, the patterned resist 326 may comprise any suitable shape in a plan view, such as a square shape, a rectangular shape, a pentagonal shape, an octagonal shape, another polygonal shape, or the like. Although FIGS. 15A and 15B illustrate one portion of a patterned resist 326, any suitable number of portions of the patterned resist 326 may be formed in any suitable locations for patterning the pillar hardmask layer 128.

The patterned resist 326 may be formed using similar methods and materials as the patterned resist 126 as described above with respect to FIGS. 2A-2B, and the details are not repeated herein. In some embodiments, additional layers of a lithography stack may be formed over the pillar hardmask layer 128 prior to forming the patterned resist 326. However, any suitable methods and materials may be used to form the patterned resist 326.

Figure 16A:
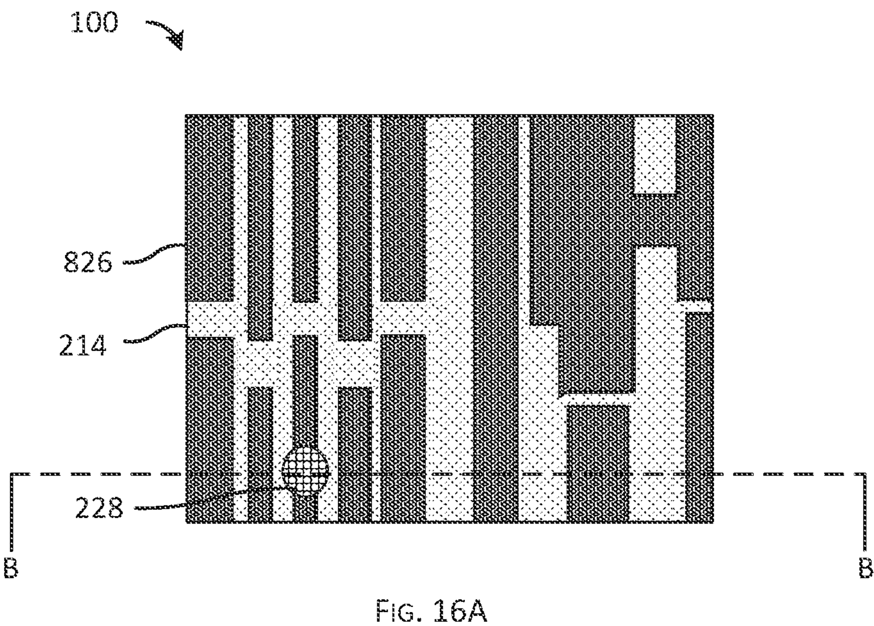
FIG. 16A illustrates a plan view of a semiconductor structure at an intermediate stage of fabrication, in accordance with some embodiments.
Figure 16B:
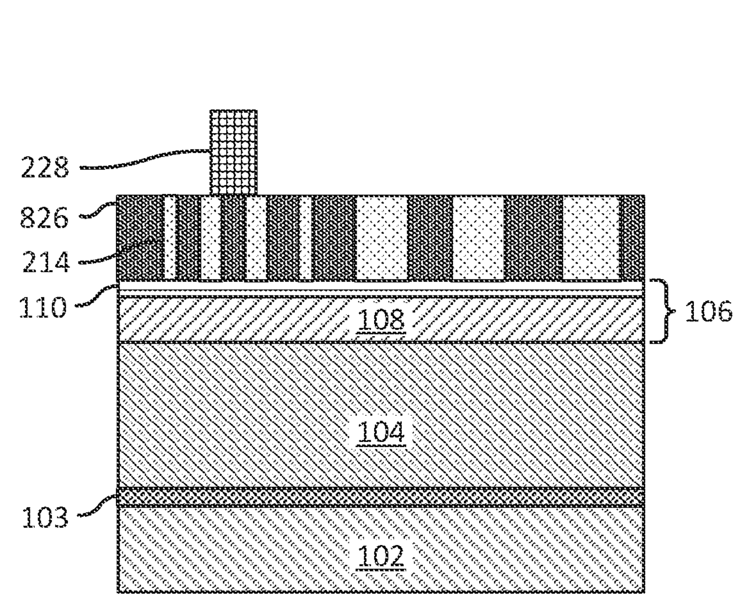
FIG. 16B illustrates a cross-sectional view of a semiconductor structure at an intermediate stage of fabrication, in accordance with some embodiments.

Next, in FIGS. 16A and 16B, the pillar hardmask layer 128 is patterned to form a pillar mask 228 (also referred to as a patterned mask), in accordance with some embodiments. In some embodiments, the patterned resist 326 (and any underlying layers of a lithography stack, if present) is used as an etch mask to form the pillar mask 228 from the pillar hardmask layer 128 with a suitable wet or dry etching process (e.g., a wet etch using ammonium hydroxide, hydrogen peroxide, or the like, or an RIE or the like using anisotropic plasma etching). After forming the pillar mask 228, any remaining portions of the patterned resist 326 (and any underlying layers of a lithography stack, if present) are removed with a suitable process, such as a CMP, an etch back, an ashing, or the like.

In some embodiments, the pillar mask 228 comprises a round shape (e.g., a circular or oval shape) in a plan view, as illustrated by FIG. 16A. However, the pillar mask 228 may comprise any suitable shape in a plan view, such as a square shape, a rectangular shape, a pentagonal shape, an octagonal shape, another polygonal shape, or the like. In various embodiments, the pillar mask 228 is centered over a mask line of the tone inversion mask 826, and portions of the pillar mask 228 extend past sidewalls of the mask line of the tone inversion mask 826 to overhang neighboring portions of the patterned mask 214. Although FIGS. 16A and 16B illustrate one portion of a pillar mask 228, any suitable number of portions of the pillar mask 228 may be formed in any suitable locations for subsequently forming pillars. For example, multiple round portions of the pillar mask 228 may be formed and centered over respective mask line of the tone inversion mask 826, and all such permutations are within the scope of the disclosed embodiments.

Figure 17A:
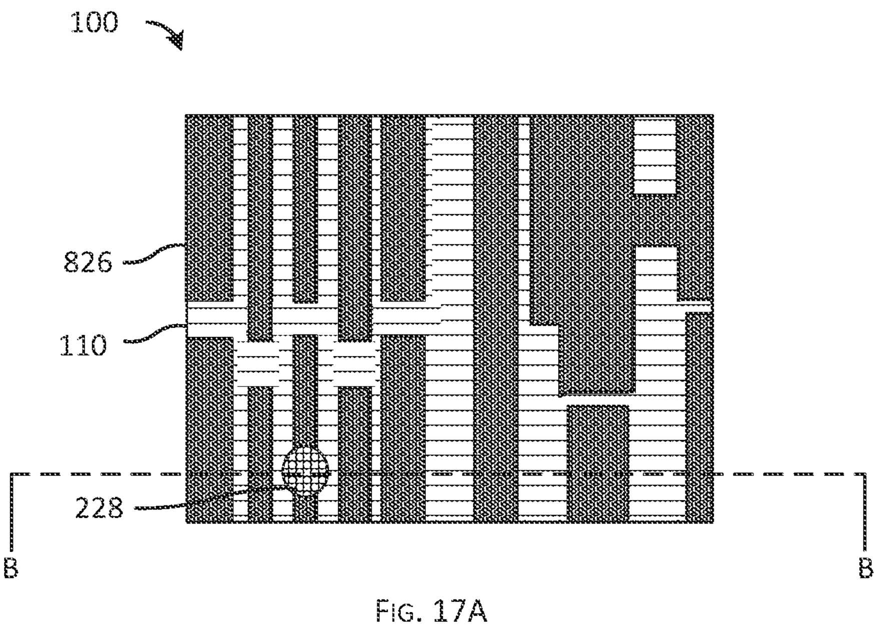
FIG. 17A illustrates a plan view of a semiconductor structure at an intermediate stage of fabrication, in accordance with some embodiments.
Figure 17B:
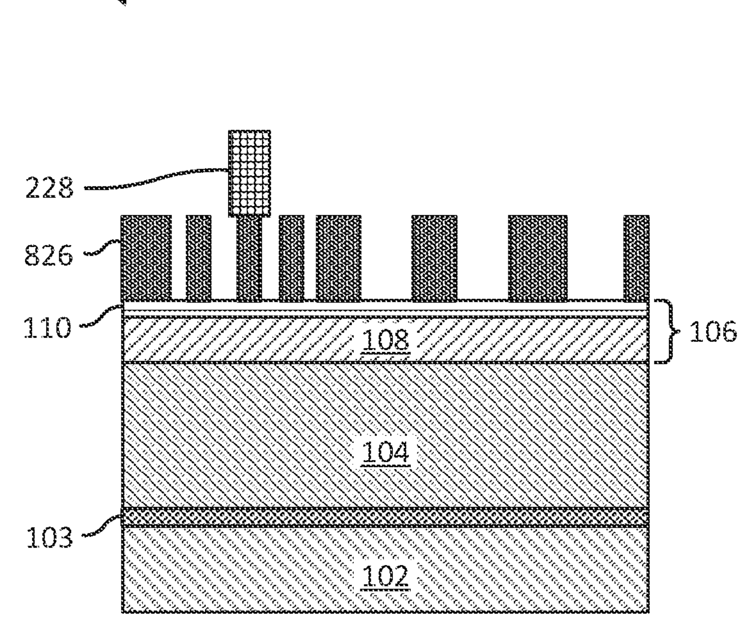
FIG. 17B illustrates a cross-sectional view of a semiconductor structure at an intermediate stage of fabrication, in accordance with some embodiments.

In FIGS. 17A and 17B, the patterned mask 214 is removed to expose portions of the top surface of the first hardmask layer 106, in accordance with some embodiments. The patterned mask 214 may be removed with a suitable wet or dry etching process (e.g., a wet etch using ammonium hydroxide, hydrogen peroxide, or the like, or an RIE or the like using anisotropic plasma etching) that is selective to the material of the patterned mask 214 (and remaining portions of the patterned stop layer 216, if present) over the materials of the tone inversion mask 826. The tone of the tone inversion mask 826 is the reverse of the tone of the patterned mask 214 and is used to transfer the reversed pattern to underlying layers (see below, FIGS. 16A-17B). In some embodiments, the etching process used to pattern the pillar hardmask layer 128 to form the pillar mask 228 (see above, FIGS. 16A-16B) is also used to remove the patterned mask 214. However, any suitable number of respective etching or other processes may be used to form the pillar mask 228 and remove the patterned mask 214, separately or combined. In various embodiments, after the removal of the patterned mask 214, portions of the pillar mask 228 extend past sidewalls of respective mask lines of the tone inversion mask 826 to overhang spaces between portions of the tone inversion mask 826.

In some embodiments, the pillar mask 228 is formed (see above, FIGS. 16A-16B) with larger critical dimensions than will be desirably transferred to the first hardmask layer 106 (see below, FIGS. 18A-18B). The pillar mask 228 may also be misaligned over the mask line of the tone inversion mask 826. For example, the pillar mask 228 may not be centered over the mask line of the tone inversion mask 826 so that more of one side of the pillar mask 228 extends past the mask line than the opposite side of the pillar mask 228. The difference from the desired critical dimensions of the pillar mask 228 and/or the misalignment of the pillar mask 228 may be measured with a suitable measurement technique, such as with a scanning electron microscope (SEM). Next, the pillar mask 228 may be trimmed in the x and y dimensions (in other words, in up to four directions including +x, +y, −x, and −y) as illustrated in the plan view illustrated by FIG. 17A. In various embodiments, the pillar mask 228 is trimmed with a gas cluster ion beam (GCIB), which may be performed in a suitable GCIB system. However, the pillar mask 228 may be trimmed with another ion beam or any other suitable trimming method.

Figure 18A:
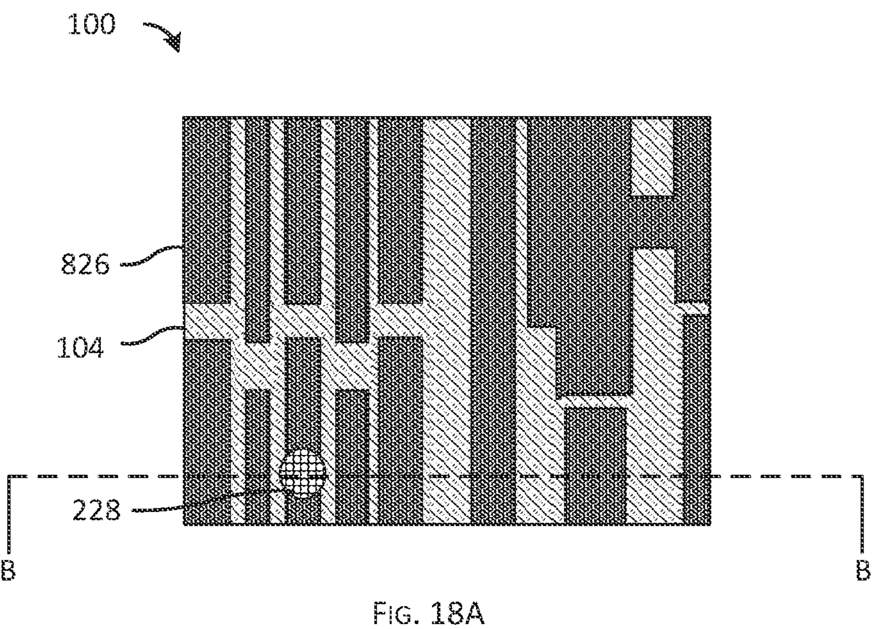
FIG. 18A illustrates a plan view of a semiconductor structure at an intermediate stage of fabrication, in accordance with some embodiments.
Figure 18B:
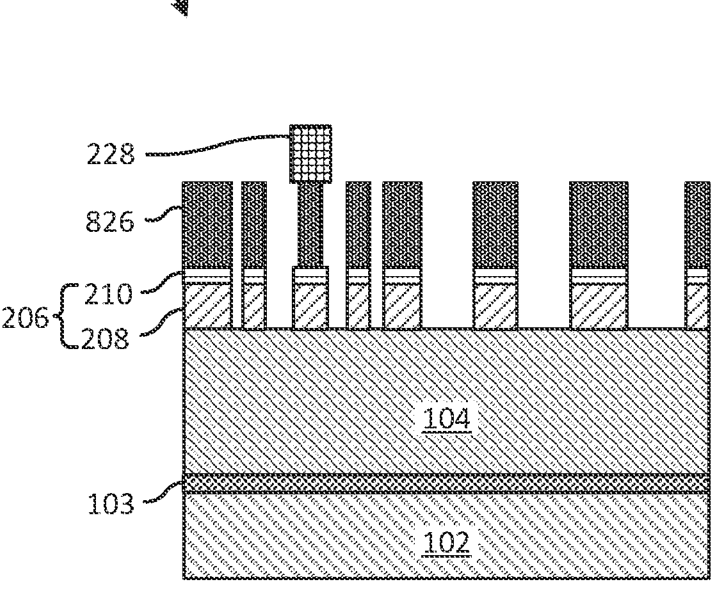
FIG. 18B illustrates a cross-sectional view of a semiconductor structure at an intermediate stage of fabrication, in accordance with some embodiments.

Next, in FIGS. 18A and 18B, the pattern of the tone inversion mask 826 and the pillar mask 228 is transferred to the first hardmask layer 106, in accordance with some embodiments. The tone inversion mask 826 and the pillar mask 228 are used as an etching mask in an etching process (e.g., a suitable wet or dry process) to extend the pattern of the tone inversion mask 826 and the pillar mask 228 through the first hardmask layer 106. This etching process patterns the first hardmask layer 106 to form a patterned hardmask 206. In some embodiments, the patterned hardmask 206 comprises a patterned stop layer 210 (formed from the first stop layer 110) over a patterned mask 208 (formed from the first mask layer 108).

The pillar mask 228 protects underlying portions of the first hardmask layer 106 so that the resulting pattern of the patterned hardmask 206 includes portions extending beyond the mask lines of the tone inversion mask 826. These portions are covered by the portions of the pillar mask 228 extending beyond sidewalls of the mask lines of the tone inversion mask 826. Portions of a top surface of the target layer 104 may be exposed by the patterned mask 208. In some embodiments, portions of the pillar mask 228 and the tone inversion mask 826 remain over the patterned stop layer 210 after the etching process.

Figure 19A:
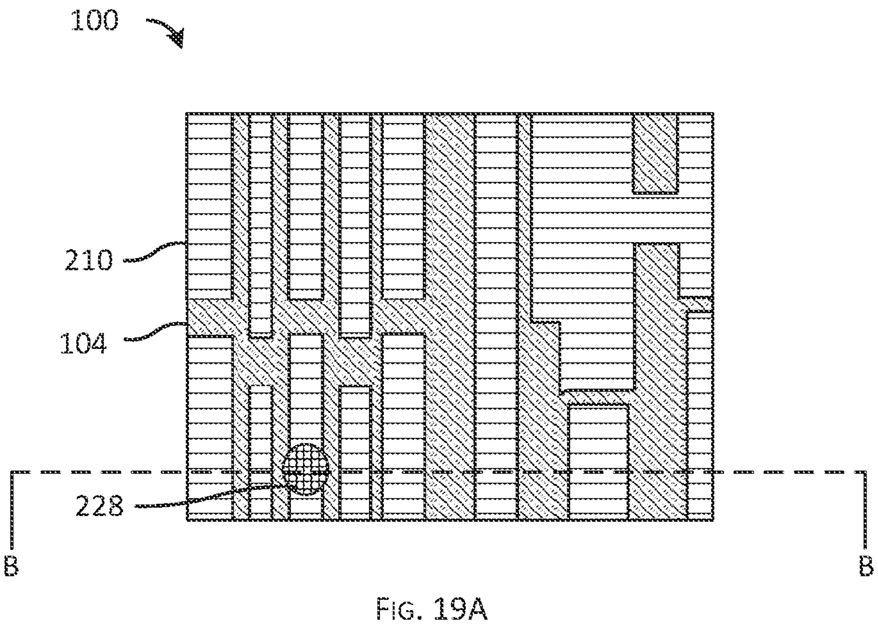
FIG. 19A illustrates a plan view of a semiconductor structure at an intermediate stage of fabrication, in accordance with some embodiments.
Figure 19B:
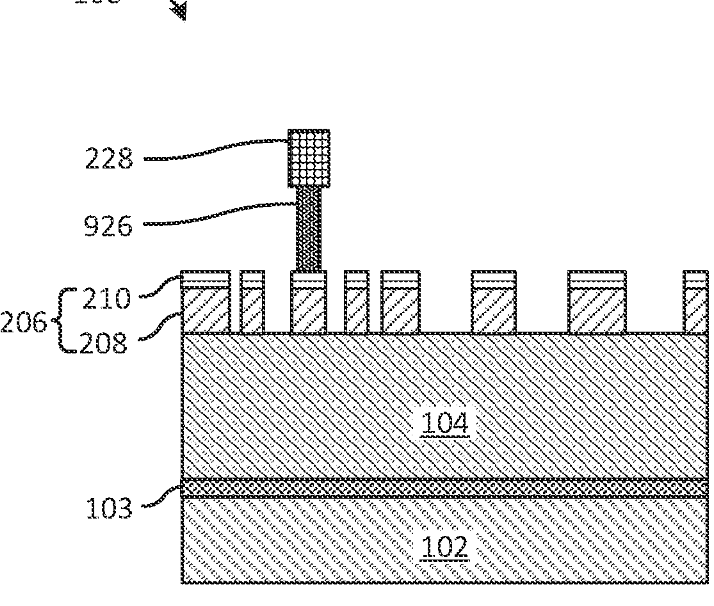
FIG. 19B illustrates a cross-sectional view of a semiconductor structure at an intermediate stage of fabrication, in accordance with some embodiments.

Subsequently, in FIGS. 19A and 19B, portions of the tone inversion mask 826 not covered by the pillar mask 228 are removed, in accordance with some embodiments. The portions of the tone inversion mask 826 not covered by the pillar mask 228 may be removed with an etching process selective to the material of the tone inversion mask 826, such as an RIE or the like using anisotropic plasma etching with halogen gases, oxygen ($O_2$), nitrogen ($N_2$), or the like as an etchant. However, any suitable method may be used to remove the portions of the tone inversion mask 826 not covered by the pillar mask 228. Portions of the tone inversion mask 826 covered by the pillar mask 228 may remain as a tone inversion pillar mask 926 after the removal of the portions of the tone inversion mask 826 not covered by the pillar mask 228. The tone inversion pillar mask 926 may support the pillar mask 228 and will be subsequently used to further pattern the patterned hardmask 206 (see below, FIGS. 22A-22B).

Figure 20A:
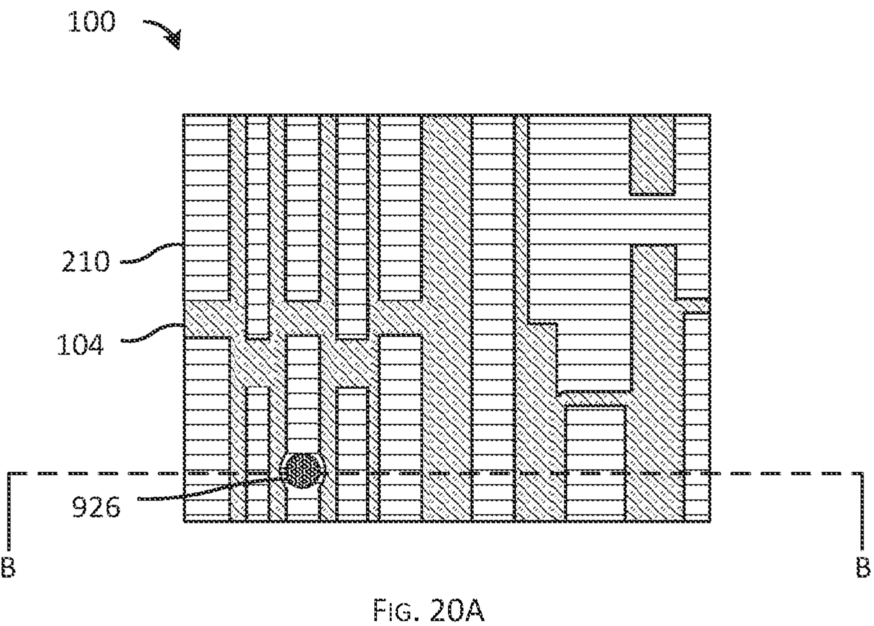
FIG. 20A illustrates a plan view of a semiconductor structure at an intermediate stage of fabrication, in accordance with some embodiments.
Figure 20B:
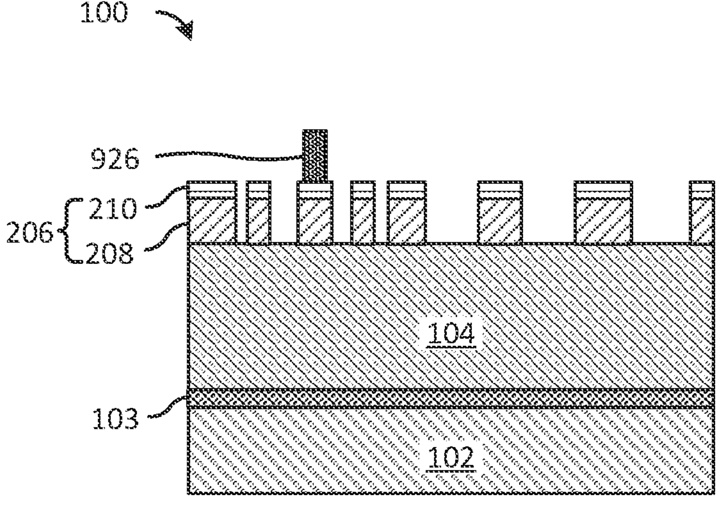
FIG. 20B illustrates a cross-sectional view of a semiconductor structure at an intermediate stage of fabrication, in accordance with some embodiments.

In FIGS. 20A and 20B, the pillar mask 228 is removed to uncover the tone inversion pillar mask 926, in accordance with some embodiments. The pillar mask 228 may be removed with an etch back, a planarization (e.g., a CMP), a wet clean, or the like. However, any suitable process may be used to remove the pillar mask 228. In some embodiments, the height of the tone inversion pillar mask 926 is decreased after the pillar mask 228 is removed.

Figure 21A:
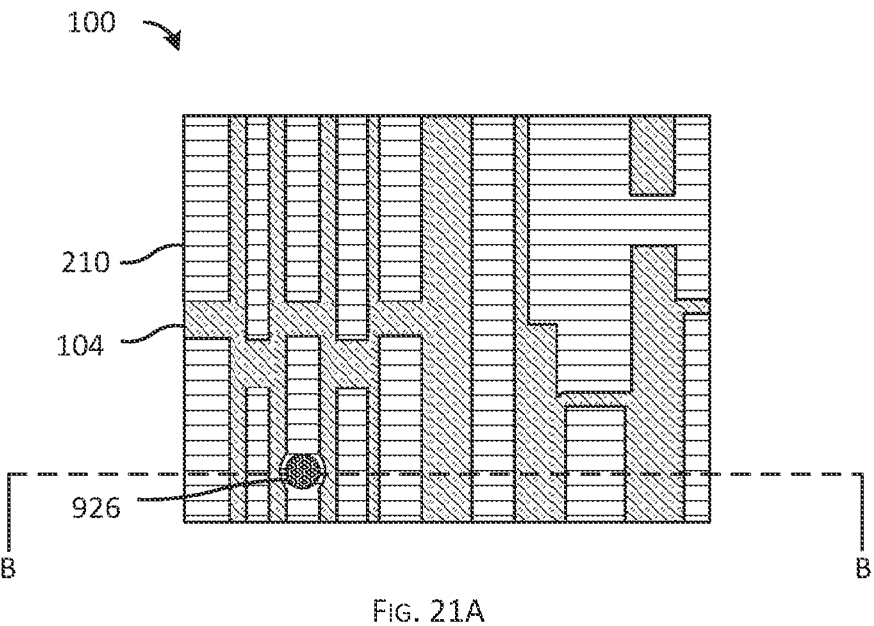
FIG. 21A illustrates a plan view of a semiconductor structure at an intermediate stage of fabrication, in accordance with some embodiments.
Figure 21B:
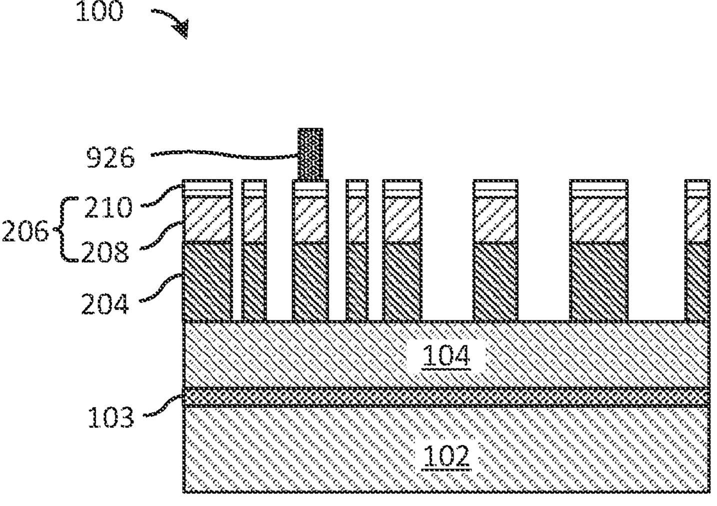
FIG. 21B illustrates a cross-sectional view of a semiconductor structure at an intermediate stage of fabrication, in accordance with some embodiments.

Next, in FIGS. 21A and 21B, the pattern of the patterned hardmask 206 is transferred to a top portion of the target layer 104 to form a pattern 204, in accordance with some embodiments. The patterned hardmask 206 is used as an etching mask in an etching process (e.g., a suitable wet or dry process) to extend the pattern of the patterned hardmask 206 into the target layer 104. This etching process patterns a top portion of the target layer 104 by etching trenches through the top portion of the target layer 104, forming a pattern 204 over a remaining bottom portion of the target layer 104. In some embodiments, the target layer 104 comprises a conductive material such as a metal (e.g., ruthenium) as described above with respect to FIGS. 1A-1B. The pattern 204 will subsequently be used to form one or more pillars, and the remaining bottom portion of the target layer 104 will subsequently be used to form various lines of, for example, a metallization pattern.

Figure 22A:
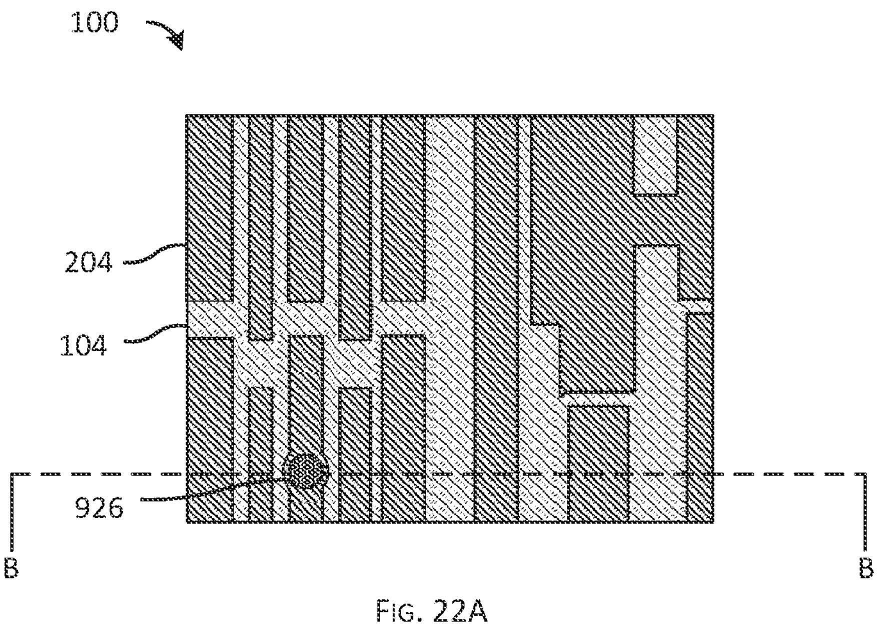
FIG. 22A illustrates a plan view of a semiconductor structure at an intermediate stage of fabrication, in accordance with some embodiments.
Figure 22B:
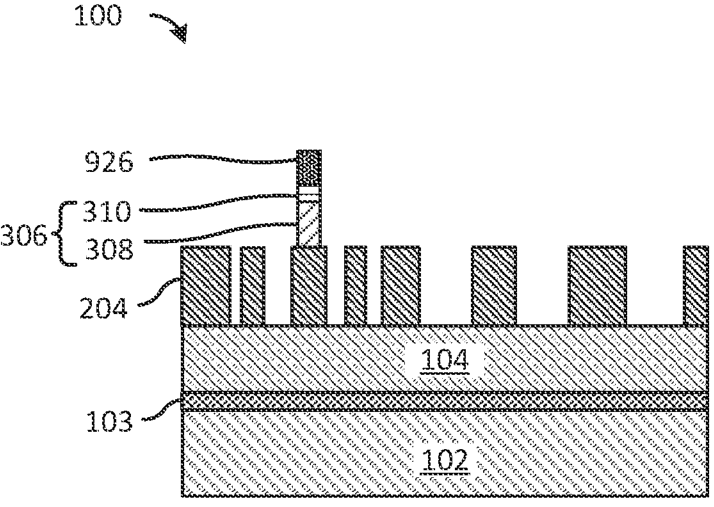
FIG. 22B illustrates a cross-sectional view of a semiconductor structure at an intermediate stage of fabrication, in accordance with some embodiments.

Subsequently, in FIGS. 22A and 22B, the patterned hardmask 206 is further patterned to remove portions of the patterned hardmask 206 not covered by the tone inversion pillar mask 926 and form a pillar hardmask 306, in accordance with some embodiments. The pillar hardmask 306 is the remaining portion of the patterned hardmask 206 covered by the tone inversion pillar mask 926. In some embodiments, the pillar hardmask 306 comprises a pillar stop layer 310 (formed from the patterned stop layer 210) over a pillar mask 308 (formed from the patterned mask 208). The pillar hardmask 306 will be subsequently used as an etch mask to form pillars from the pattern 204 (see below, FIG. 23B). The pillar hardmask 306 may be formed from the patterned hardmask 206 using an anisotropic etch process such as an RIE using halogen gases, oxygen ($O_2$), nitrogen ($N_2$), or the like as an etchant. However, any suitable process may be used to form the pillar hardmask 306.

Figure 23A:
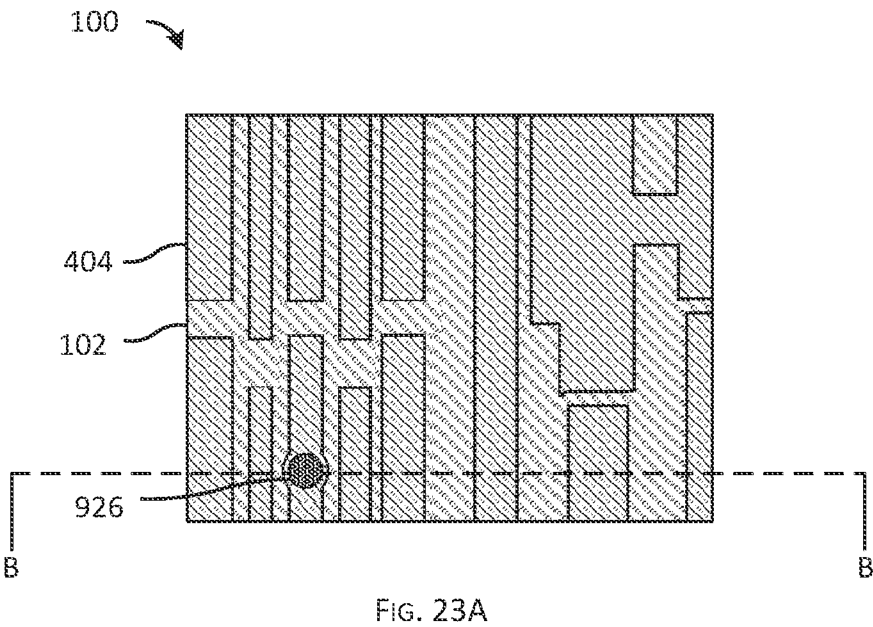
FIG. 23A illustrates a plan view of a semiconductor structure at an intermediate stage of fabrication, in accordance with some embodiments.
Figure 23B:
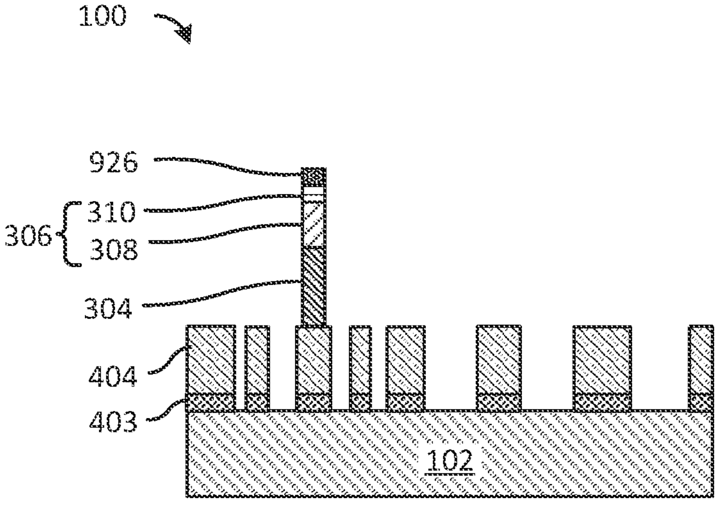
FIG. 23B illustrates a cross-sectional view of a semiconductor structure at an intermediate stage of fabrication, in accordance with some embodiments.

In FIGS. 23A and 23B, the pattern 204 is etched to form one or more pillar(s) 304 and the target layer 104 is etched to form a pattern 404, in accordance with some embodiments. The pillar hardmask 306 is used to further pattern the pattern 204 and form one or more pillar(s) 304 from portions of the pattern 204 remaining under the pillar hardmask 306. The remaining portion of the target layer 104 is etched to form a pattern 404 with a same pattern as the pattern 204 prior to the etch. In various embodiments, the one or more pillar(s) 304 and the pattern 404 are formed with a single anisotropic etch process such as an RIE using halogen gases, oxygen ($O_2$), nitrogen ($N_2$), or the like as an etchant. However, any suitable process may be used to form the one or more pillar(s) 304 and the pattern 404. In some embodiments, the anisotropic etch process further patterns the barrier layer 103 below the target layer 104 and form a barrier pattern 403 (also referred to as a liner pattern). Top surfaces of the substrate 102 may be exposed after forming the pattern 404 and the barrier pattern 403 (if present). In some embodiments, the anisotropic etch process stops on an etch stop layer (not illustrated) of the substrate 102.

Figure 24A:
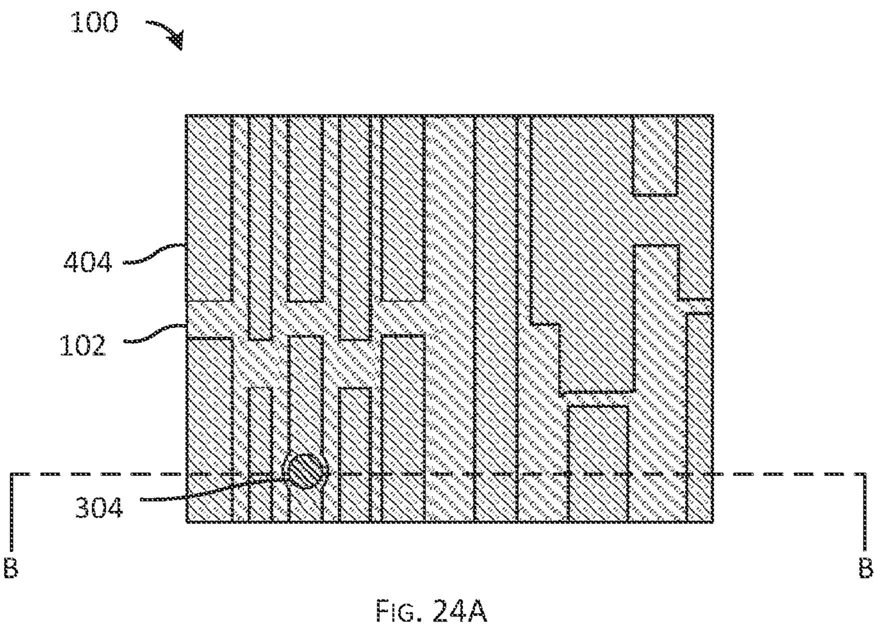
FIG. 24A illustrates a plan view of a semiconductor structure at an intermediate stage of fabrication, in accordance with some embodiments.
Figure 24B:
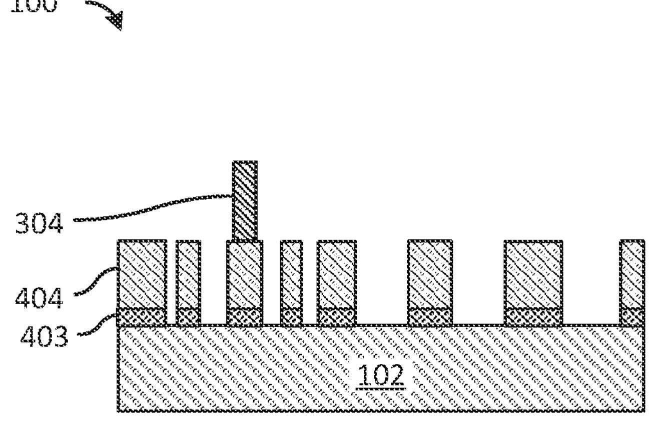
FIG. 24B illustrates a cross-sectional view of a semiconductor structure at an intermediate stage of fabrication, in accordance with some embodiments.

Next, in FIGS. 24A and 24B, remaining portions of the tone inversion pillar mask 926 (if present) and pillar hardmask 306 are removed, in accordance with some embodiments. In some embodiments, the tone inversion pillar mask 926 (if present) and pillar hardmask 306 are removed with an etch back, a planarization (e.g., a CMP), a wet clean, or the like. For example, the tone inversion pillar mask 926 (if present) and pillar hardmask 306 may be removed by a CMP after forming a filling layer 850 (see below, FIGS. 25A-25B) to cover the pattern 404 and pillar(s) 304. However, any suitable process may be used to remove the tone inversion pillar mask 926 (if present) and pillar hardmask 306.

After the removal of the tone inversion pillar mask 926 (if present) and pillar hardmask 306, respective top surface(s) of the pillar(s) 304 are exposed. The one or more pillar(s) 304 are disposed on lines of the pattern 404. In some embodiments, the one or more pillar(s) 304 and the lines of the pattern 404 are a same material, e.g., a metal such as ruthenium or the like. The pillar(s) 304 may be subsequently used to form electrical couplings from the lines of the pattern 404 with conductive features formed above the pillar(s) 304 (e.g., lines of a subsequently formed metallization pattern).

Figure 14A:
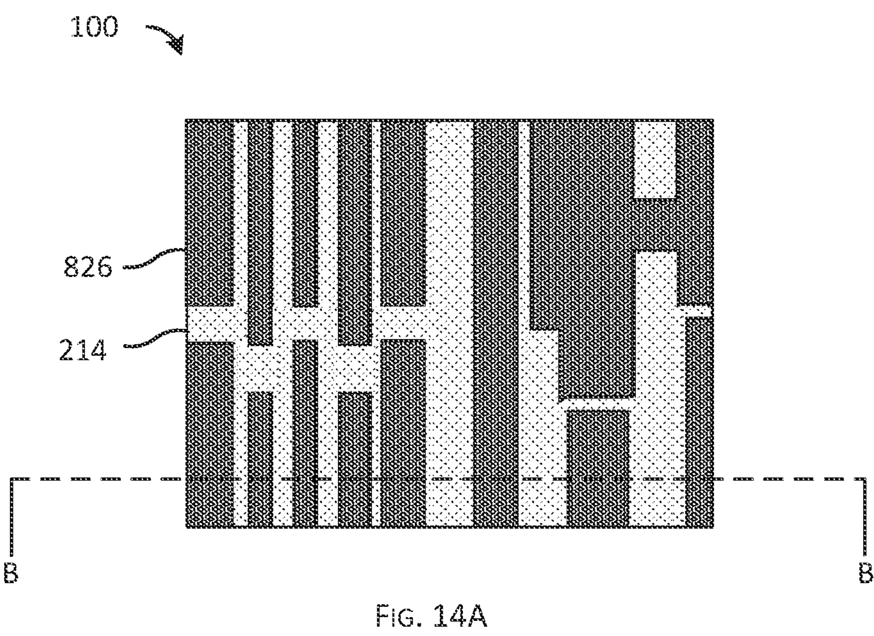
FIG. 14A illustrates a plan view of a semiconductor structure at an intermediate stage of fabrication, in accordance with some embodiments.
Figure 14B:
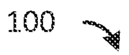
FIG. 14B illustrates a cross-sectional view of a semiconductor structure at an intermediate stage of fabrication, in accordance with some embodiments.
Figure 14B:
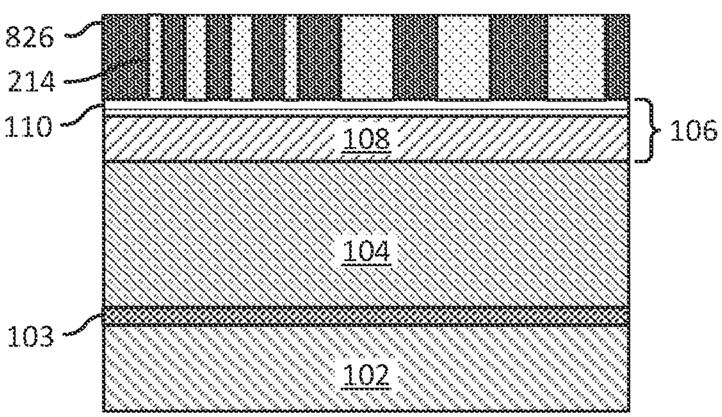

In various embodiments, the pillar(s) 304 comprise respective round shape(s) (e.g., circular or oval shapes) in a plan view, as illustrated by FIG. 14A. However, the pillar(s) 304 may comprise any suitable shapes in a plan view, such as square shapes, rectangular shapes, pentagonal shapes, octagonal shapes, other polygonal shapes, or the like. Although FIGS. 15A and 15B illustrate one pillar 304, any suitable number of pillars 304 may be formed in any suitable locations on the pattern 404. The portions of the pattern 404 (e.g., lines) on which the pillar(s) 304 rest (also referred to as base portions) are wider than bottom widths of the pillar(s) 304. In some embodiments, the pillar(s) 304 have a bottom width in a range of 8 nm to 25 nm, and the line(s) on which the pillar(s) 304 have a top width in a range of 10 nm to 30 nm, such that the bottom width of the pillar(s) 304 is smaller than the top width of the underlying line(s) of the pattern 404. This may be advantageous for reducing misalignment error of the pillar(s) 304. The base portions of the pattern 404 on which pillar(s) 304 are disposed are wider than adjacent portions of the pattern 404. In some embodiments, the base portions of the pattern 404 on which pillar(s) 304 are disposed have round shapes in a plan view.

Figure 25A:
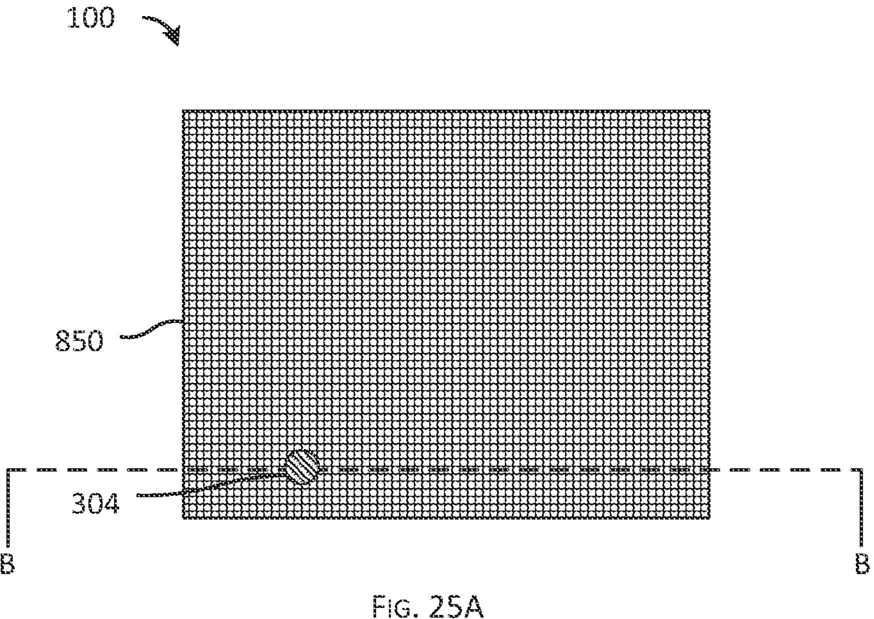
FIG. 25A illustrates a plan view of a semiconductor structure at an intermediate stage of fabrication, in accordance with some embodiments.
Figure 25B:
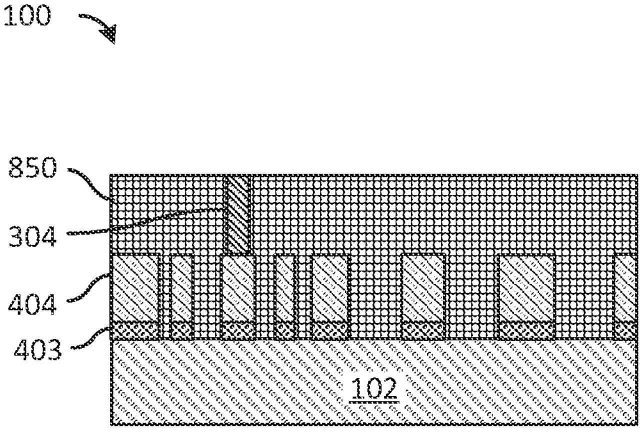
FIG. 25B illustrates a cross-sectional view of a semiconductor structure at an intermediate stage of fabrication, in accordance with some embodiments.

Subsequently, in FIGS. 25A and 25B, the gaps between the pattern 404 are filled with a filling layer 850, in accordance with some embodiments. As an example, when the pattern 404 is a metallization pattern, the gaps or trenches between the lines of the metallization pattern are filled with a dielectric material such as silicon oxide, silicon dioxide, silicon nitride, silicon carbide, a silicon-based dielectric material with a low dielectric constant (i.e., low-k value) (e.g., organosilicate glass (SiCOH), dense SiCOH, porous SiCOH, and other porous dielectric materials), silicon oxynitride ($SiO_xN_y$), the like, or a combination thereof. The filling layer 850 may be further deposited to cover sidewalls of the pillar(s) 304. The dielectric material may be formed with a suitable process such as CVD, PECVD, ALD, spin-on, the like, or a combination thereof. However, any suitable process may be used to form the dielectric material for the filling layer 850. Excess dielectric material formed over a top surface of the pillar(s) 304 may be removed with a suitable process, e.g. a CMP. Remaining portions of the tone inversion pillar mask 926 (if present) and pillar hardmask 306, if present, may be removed with the same process. After forming the filling layer 850, additional interconnect layers comprising, for example, conductive lines and vias or pillars may be formed over the filling layer 850 and pillar(s) 304.

Figure 26:
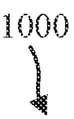
FIG. 26 illustrates a flow chart diagram for a method for processing a substrate, in accordance with some embodiments.
Figure 26:
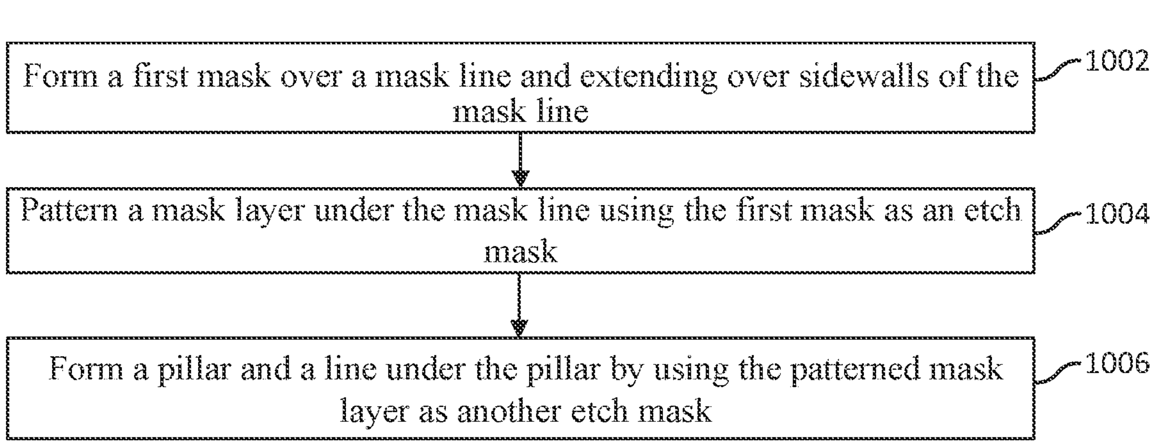

FIG. 26 illustrates a flow chart diagram of a method 1000 for processing a substrate, in accordance with some embodiments. In step 1002, a first mask is formed over a mask line, as described above with respect to FIGS. 15A-16B. The first mask extends over sidewalls of the mask line. In step 1004, a patterned mask is formed by patterning a mask layer using the first mask as an etch mask, as described above with respect to FIGS. 18A-18B. The mask layer is under the mask line. In step 1006, a pillar and a line under the pillar are formed from a target layer with an etch process by using the patterned mask layer as another etch mask, as described above with respect to FIGS. 21A-23B.

Figure 27:
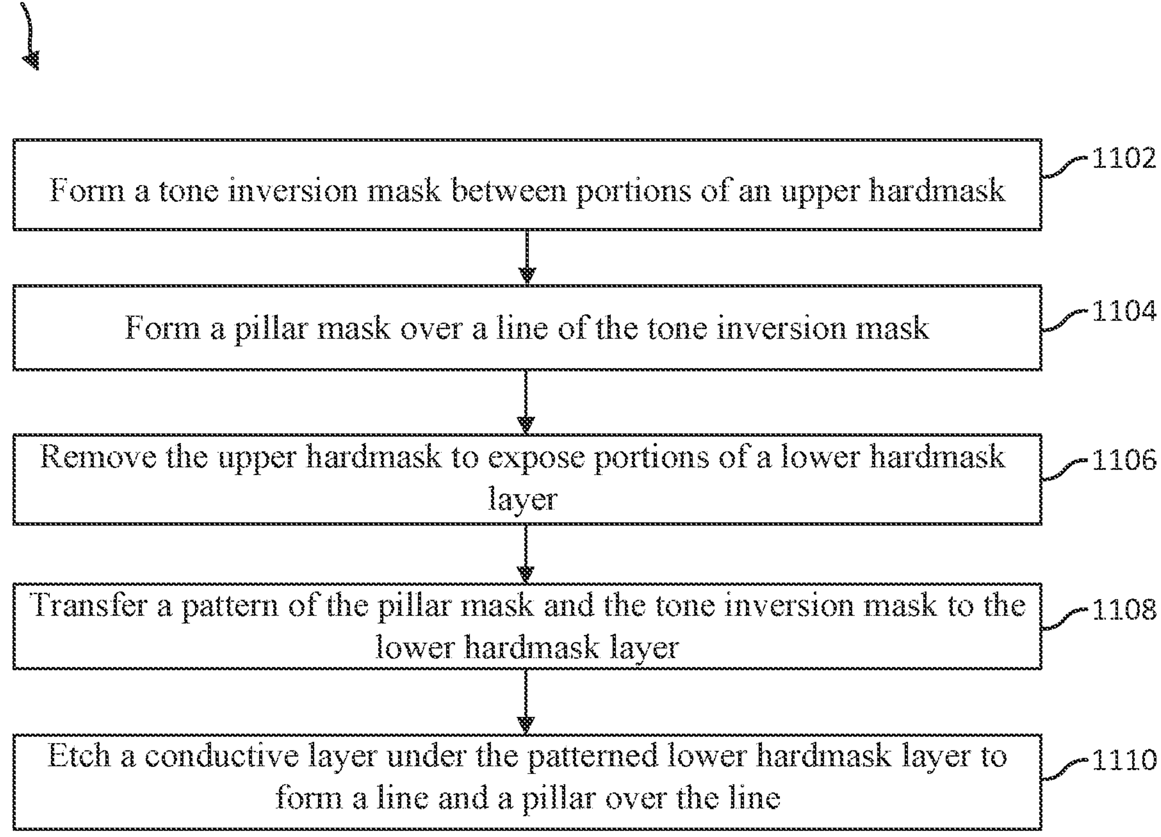
FIG. 27 illustrates a flow chart diagram for another method for processing a substrate, in accordance with some embodiments.

FIG. 27 illustrates a flow chart diagram of another method 1100 for processing a substrate, in accordance with some embodiments. In step 1102, a tone inversion mask is formed between portions of an upper hardmask, as described above with respect to FIGS. 13A-14B. In step 1104, a pillar mask is formed over a line of the tone inversion mask, as described above with respect to FIGS. 15A-16B. In step 1106, the upper hardmask is removed, as described above with respect to FIGS. 17A-17B. The removal of the upper hardmask exposes portions of a lower hardmask layer.

In step 1108, a pattern of the pillar mask and the tone inversion mask is transferred to the lower hardmask layer, as described above with respect to FIGS. 18A-18B. In step 1110, a conductive layer under the patterned lower hardmask layer is etched by using the patterned lower hardmask layer as an etching mask, as described above with respect to FIGS. 21A-23B. The etching forms a line and a pillar over the line.

Figure 28:
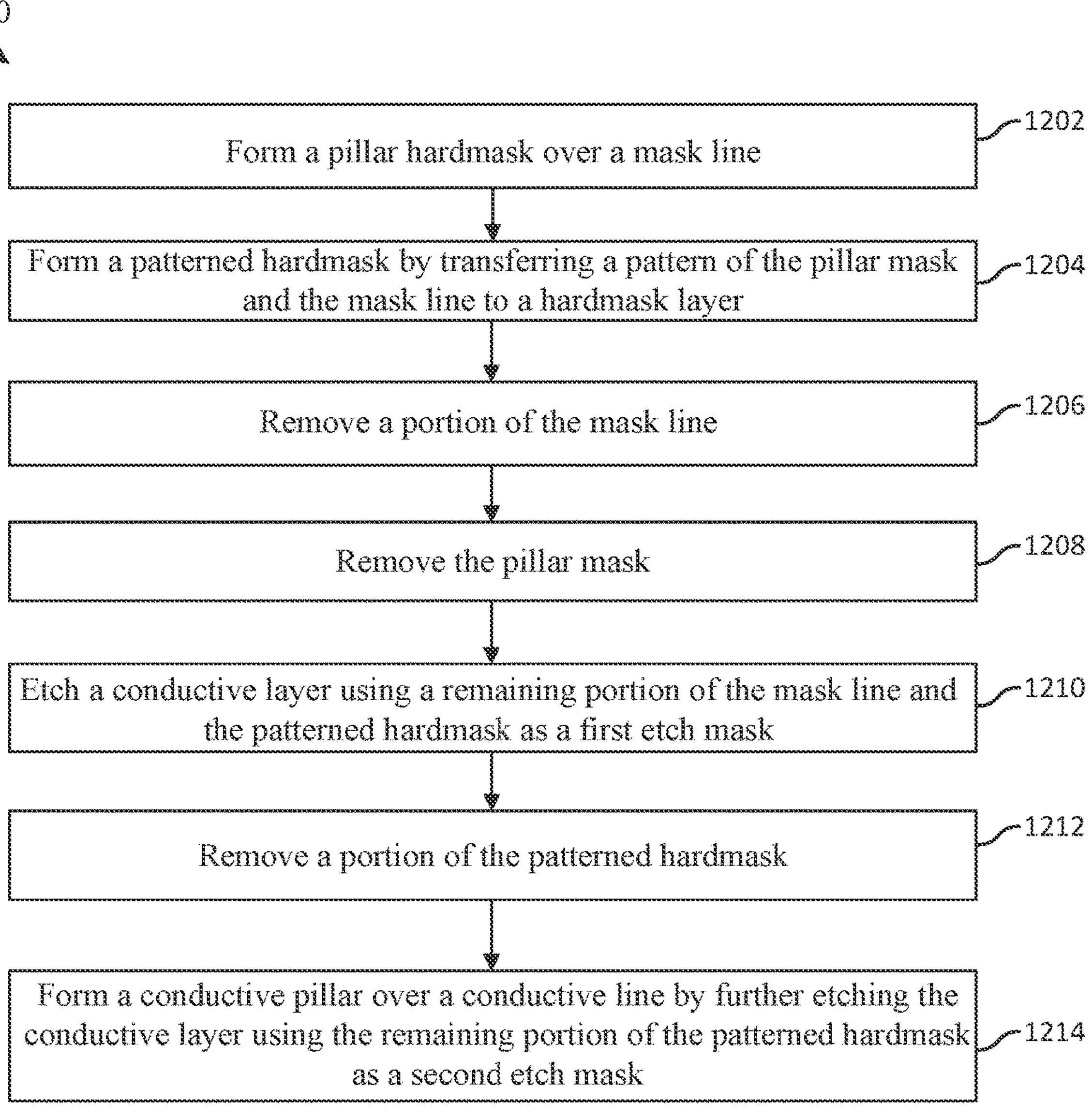
FIG. 28 illustrates a flow chart diagram for yet another method for processing a substrate, in accordance with some embodiments.

FIG. 28 illustrates a flow chart diagram of yet another method 1200 for processing a substrate, in accordance with some embodiments. In step 1202, a pillar mask is formed over a mask line, as described above with respect to FIGS. 15A-16B. The mask line is over a hardmask layer, and the hardmask layer covers a conductive layer.

In step 1204, a patterned hardmask is formed by transferring a pattern of the pillar mask and the mask line to the hardmask layer, as described above with respect to FIGS. 18A-18B. In step 1206, a portion of the mask line is removed, as described above with respect to FIGS. 19A-19B. A remaining portion of the mask line is covered by the pillar mask. In step 1208, the pillar mask is removed, as described above with respect to FIGS. 20A-20B.

In step 1210, the conductive layer is etched using the remaining portion of the mask line and the patterned hardmask as a first etch mask, as described above with respect to FIGS. 21A-21B. In step 1212, a portion of the patterned hardmask is removed, as described above with respect to FIGS. 22A-22B. A remaining portion of the patterned hardmask is covered by the remaining portion of the mask line.

In step 1214, a conductive pillar over a conductive line is formed by further etching the conductive layer using the remaining portion of the patterned hardmask as a second etch mask, as described above with respect to FIGS. 23A-23B. The conductive pillar is under the second etch mask.

Example embodiments of the disclosure are described below. Other embodiments can also be understood from the entirety of the specification as well as the claims filed herein.

Example 1. A method for processing a substrate, the method including: forming a first mask over a mask line, the first mask extending over sidewalls of the mask line; forming a patterned mask by patterning a mask layer using the first mask as an etch mask, the mask layer being under the mask line; and forming a pillar and a line under the pillar from a target layer with an etch process by using the patterned mask layer as another etch mask.

Example 2. The method of example 1, where the pillar and the line include a conductive material.

Example 3. The method of example 2, where the conductive material includes ruthenium.

Example 4. The method of one of examples 1 to 3, where the first mask includes a round shape in a top view.

Example 5. The method of one of examples 1 to 4, where the line has a first width, the pillar has a second width, and the second width is smaller than the first width.

Example 6. The method of one of examples 1 to 5, where the first mask includes a first material and the mask line includes a second material, the second material being different from the first material.

Example 7. The method of example 6, where the first material is a nitride.

Example 8. The method of one of examples 6 or 7, where the second material is an oxide.

Example 9. A method for processing a substrate, the method including: forming a tone inversion mask between portions of an upper hardmask; forming a pillar mask over a line of the tone inversion mask; removing the upper hardmask, the removal of the upper hardmask exposing portions of a lower hardmask layer; transferring a pattern of the pillar mask and the tone inversion mask to the lower hardmask layer; and etching a conductive layer under the patterned lower hardmask layer by using the patterned lower hardmask layer as an etching mask, the etching forming a line and a pillar over the line.

Example 10. The method of example 9, where the pillar mask extends over the portions of the upper hardmask.

Example 11. The method of one of examples 9 or 10, where the line and the pillar include a same conductive material.

Example 12. The method of example 11, where the same conductive material is ruthenium.

Example 13. The method of one of examples 9 to 12, where forming the pillar mask includes: depositing a pillar hardmask layer over the tone inversion mask and the upper hardmask; patterning a pillar photoresist mask over the pillar hardmask layer; and transferring a pattern of the pillar photoresist mask to the pillar hardmask layer with an etch process.

Example 14. The method of example 13, where the etch process used to transfer the pattern of the pillar photoresist mask to the pillar hardmask layer is also used to remove the upper hardmask.

Example 15. The method of example 14, where the pillar hardmask layer and the upper hardmask are a same material.

Example 16. The method of one of examples 13 to 15, where forming the pillar mask further includes measuring critical dimensions of the pillar mask with a scanning electron microscope.

Example 17. The method of one of examples 13 to 16, where forming the pillar mask further includes measuring the pillar mask for misalignment over the line of the tone inversion mask with a scanning electron microscope.

Example 18. The method of one of examples 13 to 17, where forming the pillar mask further includes trimming the pillar mask with a gas cluster ion beam.

Example 19. The method of one of examples 9 to 18, where the line and the pillar are formed with a single etch process.

Example 20. A method for processing a substrate, the method including: forming a pillar mask over a mask line, the mask line being over a hardmask layer, the hardmask layer covering a conductive layer; forming a patterned hardmask by transferring a pattern of the pillar mask and the mask line to the hardmask layer; removing a portion of the mask line, a remaining portion of the mask line being covered by the pillar mask; removing the pillar mask; etching the conductive layer using the remaining portion of the mask line and the patterned hardmask as a first etch mask; removing a portion of the patterned hardmask, a remaining portion of the patterned hardmask being covered by the remaining portion of the mask line; and forming a conductive pillar over a conductive line by further etching the conductive layer using the remaining portion of the patterned hardmask as a second etch mask, the conductive pillar being under the second etch mask.

Example 21. The method of example 20, where the conductive line and the conductive pillar are ruthenium.

Example 22. The method of one of examples 20 or 21, where the conductive pillar is formed on a base portion of the conductive line, the base portion of the conductive line including a round shape in a plan view.

Example 23. The method of one of examples 20 to 22, where etching the conductive layer using the remaining portion of the mask line and the patterned hardmask includes forming a trench in the conductive layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

forming a first mask over a mask line, the first mask extending over sidewalls of the mask line;

forming a patterned mask by patterning a mask layer using the first mask as an etch mask, the mask layer being under the mask line; and forming a pillar and a line under the pillar from a target layer with an etch process by using the patterned mask layer as another etch mask, the line surrounding the pillar in a top view.

2. The method of claim 1, wherein the pillar and the line comprise a conductive material.

3. The method of claim 2, wherein the conductive material comprises ruthenium.

4. The method of claim 1, wherein the first mask comprises a round shape in a top view.

5. The method of claim 1, wherein the first mask comprises a first material and the mask line comprises a second material, the second material being different from the first material.

6. The method of claim 5, wherein the first material is a nitride.

7. The method of claim 5, wherein the second material is an oxide.

8. The method of claim 1, wherein the line has curved sidewalls adjacent the pillar in the top view.

9. A method for processing a substrate, the method comprising:

forming a tone inversion mask between portions of an upper hardmask;

forming a pillar mask over a line of the tone inversion mask;

removing the upper hardmask, the removal of the upper hardmask exposing portions of a lower hardmask layer;

transferring a pattern of the pillar mask and the tone inversion mask to the lower hardmask layer; and etching a conductive layer under the patterned lower hardmask layer by using the patterned lower hardmask layer as an etching mask, the etching forming a line and a pillar over the line.

10. The method of claim 9, wherein the pillar mask extends over the portions of the upper hardmask.

11. The method of claim 9, wherein the line and the pillar comprise a same conductive material.

12. The method of claim 11, wherein the same conductive material is ruthenium.

13. The method of claim 9, wherein forming the pillar mask comprises:

depositing a pillar hardmask layer over the tone inversion mask and the upper hardmask;

patterning a pillar photoresist mask over the pillar hardmask layer; and transferring a pattern of the pillar photoresist mask to the pillar hardmask layer with an etch process.

14. The method of claim 13, wherein the etch process used to transfer the pattern of the pillar photoresist mask to the pillar hardmask layer is also used to remove the upper hardmask.

15. The method of claim 14, wherein the pillar hardmask layer and the upper hardmask are a same material.

16. The method of claim 13, wherein forming the pillar mask further comprises measuring critical dimensions of the pillar mask with a scanning electron microscope.

17. The method of claim 13, wherein forming the pillar mask further comprises measuring the pillar mask for misalignment over the line of the tone inversion mask with a scanning electron microscope.

18. The method of claim 13, wherein forming the pillar mask further comprises trimming the pillar mask with a gas cluster ion beam.

19. The method of claim 9, wherein the line and the pillar are formed with a single etch process.

20. A method for processing a substrate, the method comprising:

forming a pillar mask over a mask line, the mask line being over a hardmask layer, the hardmask layer covering a conductive layer;

forming a patterned hardmask by transferring a pattern of the pillar mask and the mask line to the hardmask layer;

removing a portion of the mask line, a remaining portion of the mask line being covered by the pillar mask;

removing the pillar mask;

etching the conductive layer using the remaining portion of the mask line and the patterned hardmask as a first etch mask;

removing a portion of the patterned hardmask, a remaining portion of the patterned hardmask being covered by the remaining portion of the mask line; and forming a conductive pillar over a conductive line by further etching the conductive layer using the remaining portion of the patterned hardmask as a second etch mask, the conductive pillar being under the second etch mask.

21. The method of claim 20, wherein the conductive line and the conductive pillar are ruthenium.

22. The method of claim 20, wherein the conductive pillar is formed on a base portion of the conductive line, the base portion of the conductive line comprising a round shape in a plan view.

23. The method of claim 20, wherein etching the conductive layer using the remaining portion of the mask line and the patterned hardmask comprises forming a trench in the conductive layer.

* * * * *